US012712023B2

(12) United States Patent
Jiang et al.

(10) Patent No.: US 12,712,023 B2

(45) Date of Patent: Aug. 18, 2026

(54) MEMORY DEVICE, MEMORY SYSTEM, AND OPERATION METHOD OF MEMORY DEVICE

(71) Applicant: YANGTZE MEMORY TECHNOLOGIES CO., LTD., Wuhan (CN)

(72) Inventors: SongMin Jiang, Wuhan (CN); HongTao Liu, Wuhan (CN); Pengyu Xu, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 193 days.

(21) Appl. No.: 18/634,661

(22) Filed: Apr. 12, 2024

(65) Prior Publication Data

US 2025/0140319 A1 May 1, 2025

(30) Foreign Application Priority Data

Oct. 31, 2023 (CN) ......................... 202311451239.6

(51) Int. Cl.

*G11C 16/10* (2006.01)
*G11C 16/04* (2006.01)
*G11C 16/08* (2006.01)
*G11C 16/34* (2006.01)

(52) U.S. Cl.

CPC ........ *G11C 16/102* (2013.01); *G11C 16/0483* (2013.01); *G11C 16/08* (2013.01); *G11C 16/10* (2013.01); *G11C 16/3404* (2013.01)

(58) Field of Classification Search

CPC ... G11C 16/102; G11C 16/0483; G11C 16/08; G11C 16/10; G11C 16/3404; G11C 11/5628

See application file for complete search history.

(56) References Cited

U.S. PATENT DOCUMENTS 10,147,491 B2 * 12/2018 Lee .................... G11C 11/5628
2010/0128523 A1 5/2010 Yip
2012/0170364 A1 * 7/2012 Jang .................. G11C 16/3459 365/185.03
2021/0134359 A1 * 5/2021 Park ....................... H10B 41/27
2021/0295918 A1 * 9/2021 Chai ..................... G11C 16/10
2023/0015493 A1 * 1/2023 Jung ..................... G11C 16/10

(Continued)

FOREIGN PATENT DOCUMENTS

CN 102543192 A 7/2012
CN 110870015 A 3/2020

(Continued)

OTHER PUBLICATIONS

Yangtze Memory Technologies Co., Ltd., "First Examination Opinion Notice," published Aug. 30, 2025, Chinese Patent App. No. 202311451239.6, 11 p. (translation 11 p.).

*Primary Examiner* — Amir Zarabian
*Assistant Examiner* — Justin Bryce Heisterkamp
(74) *Attorney, Agent, or Firm* — Conley Rose, P.C.

(57) ABSTRACT

Examples of the present application disclose a memory device, a memory system, and an operation method of a memory device. In the method, prior to ISPP programming of memory cells of selected memory cells, a first preprogram pulse is first applied to a selected word line to preprogram a first class of memory cells of the selected memory cells.

18 Claims, 16 Drawing Sheets

(56) References Cited

U.S. PATENT DOCUMENTS

| | | | | |
|---|---|---|---|---|
| 2023/0253058 | A1* | 8/2023 | Kim | G11C 16/102 |
| | | | | 365/230.03 |
| 2024/0120019 | A1* | 4/2024 | Kim | G11C 16/3459 |
| 2024/0290401 | A1* | 8/2024 | Lee | G11C 16/3409 |

FOREIGN PATENT DOCUMENTS

| | | | |
|---|---|---|---|
| CN | 112786093 | A | 5/2021 |
| CN | 116631481 | A | 8/2023 |

* cited by examiner

PROVIDE A FIRST PREPROGRAM PULSE TO A SELECTED WORD LINE TO PREPROGRAM A FIRST CLASS OF MEMORY CELLS OF A SELECTED MEMORY CELL ROW, WHEREIN A TARGET PROGRAMMED STATE OF THE FIRST CLASS OF MEMORY CELLS IS A FIRST TARGET PROGRAMMED STATE, AFTER PROVISION OF THE FIRST PREPROGRAM PULSE A THRESHOLD VOLTAGE OF THE FIRST CLASS OF MEMORY CELLS IS LESS THAN A FIRST TARGET THRESHOLD VOLTAGE, AND THE FIRST TARGET THRESHOLD VOLTAGE IS A THRESHOLD VOLTAGE CORRESPONDING TO THE FIRST TARGET PROGRAMMED STATE — 801

PROVIDE PROGRAM PULSES TO THE SELECTED WORD LINE USING ISPP, SO AS TO PROGRAM MEMORY CELLS OF THE SELECTED MEMORY CELL ROW — 802

FIG. 8

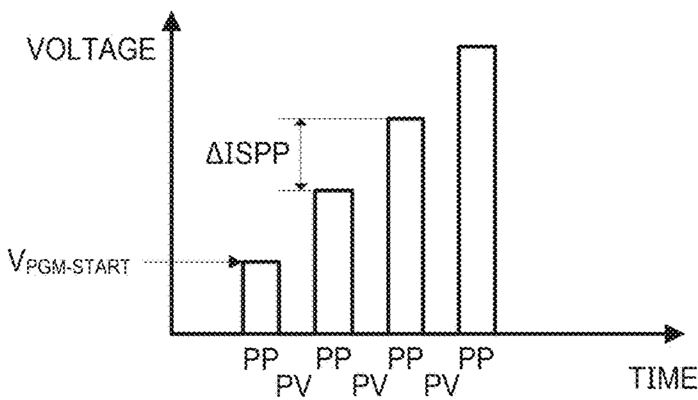

FIG. 9

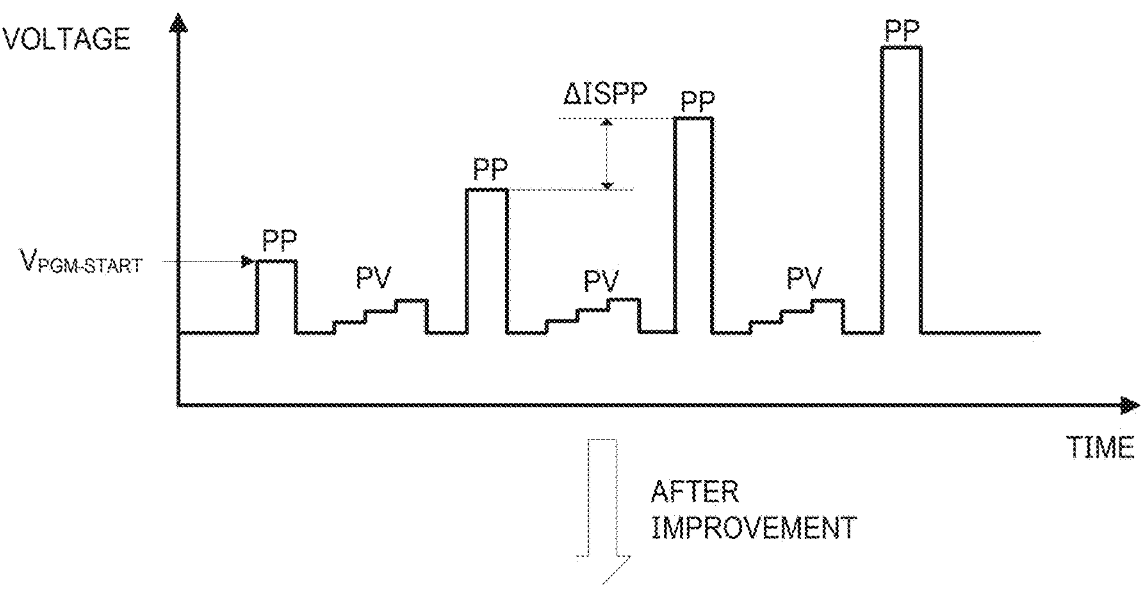
AFTER IMPROVEMENT
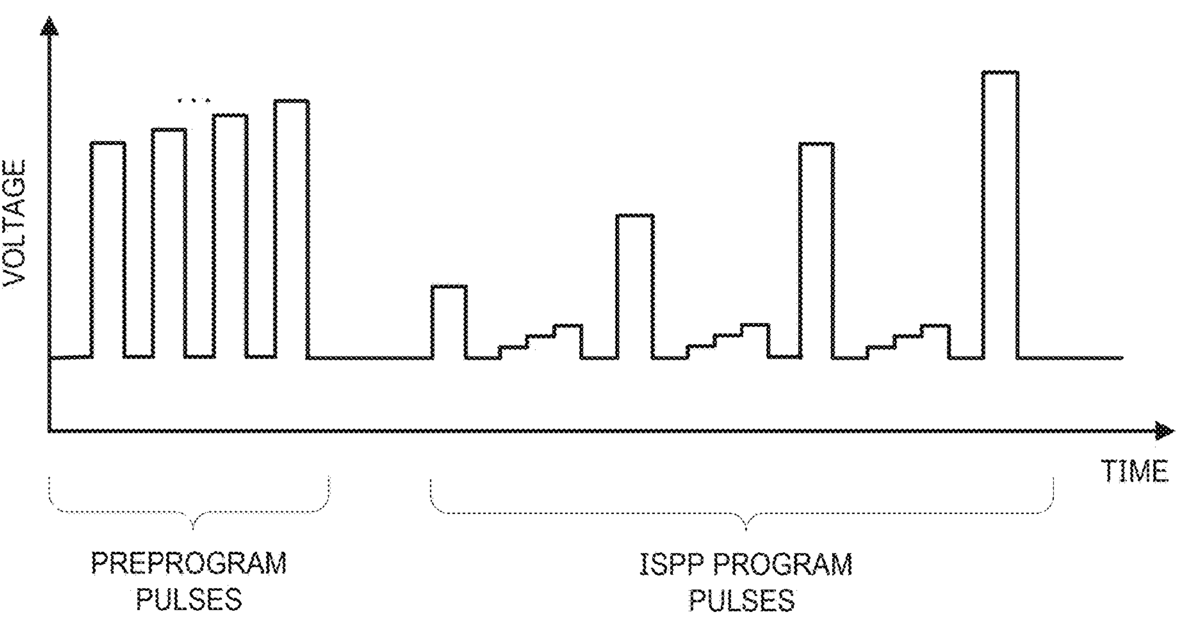
FIG. 12

MEMORY DEVICE, MEMORY SYSTEM, AND OPERATION METHOD OF MEMORY DEVICE

CROSS-REFERENCE TO RELATED APPLICATIONS

The present application claims priority to Chinese Patent Application No. 2023114512396, which was filed Oct. 31, 2023, is titled "MEMORY DEVICE, MEMORY SYSTEM, AND OPERATION METHOD OF MEMORY DEVICE," and is hereby incorporated herein by reference in its entirety.

TECHNICAL FIELD

Examples of the present application relate to the technical field of memories, and particularly to a memory device, a memory system, and an operation method of a memory device.

BACKGROUND

During programming (e.g., data write) of a memory cell in a memory device, such as a 3D NAND (NAND gate) memory device, in order to improve the accuracy of subsequent data read, the range of threshold voltage distributions of various memory cells reaching the same target programmed state is typically minimized. As such, a distance between threshold voltage distribution ranges of two adjacent target programmed states may be increased, that is, a read window may be increased.

SUMMARY

Examples of the present application provide a memory device, a memory system, and an operation method of a memory device, which can increase a read window. The technical solutions are as follows:

In a first aspect, a memory device is provided, which comprises:

- a memory array comprising a plurality of memory cells;
- a plurality of word lines coupled to the plurality of memory cells respectively; and
- a peripheral circuit coupled to the plurality of word lines and configured to:
- provide a first preprogram pulse to a selected word line to preprogram a first class of memory cells of a selected memory cell row, wherein a target programmed state of the first class of memory cells is a first target programmed state, after provision of the first preprogram pulse a threshold voltage of the first class of memory cells is less than a first target threshold voltage, and the first target threshold voltage is a threshold voltage corresponding to the first target programmed state; and
- provide program pulses to the selected word line using increment step pulse programming (ISPP), so as to program memory cells of the selected memory cell row.

In an example, the peripheral circuit is further configured to:

- provide a second preprogram pulse to the selected word line, so as to preprogram a second class of memory cells of the selected memory cell row,
- wherein a target programmed state of the second class of memory cells is a second target programmed state, after provision of the second preprogram pulse a threshold voltage of the second class of memory cells is less than a second target threshold voltage, and the second target threshold voltage is a threshold voltage corresponding to the second target programmed state.

In an example, before the provision of the first preprogram pulse, a distance between a state of the first class of memory cells and the first target programmed state is greater than a distance between a state of at least one other memory cell in the selected memory cell row and a respective target programmed state.

In an example, a difference between a voltage of the first preprogram pulse and a first target program voltage is less than a first difference threshold, and the first target program voltage is set based on a program voltage required by a programmed state of the first class of memory cells to reach the first target programmed state.

In an example, the peripheral circuit is further configured to:

- determine the first preprogram pulse based on a difference between a current threshold voltage of at least one memory cell in the first class of memory cells and the first target threshold voltage.

In an example, the peripheral circuit is configured to:

- if the difference between the current threshold voltage of the at least one memory cell in the first class of memory cells and the first target threshold voltage exceeds a second difference threshold, configure the first preprogram pulse for the first class of memory cells.

In an example, the peripheral circuit is configured to:

- in response to a programming instruction from a controller, provide the first preprogram pulse to the selected word line, so as to preprogram the first class of memory cells of the selected memory cell row.

In an example, the memory cells in the memory device are triple-level cells (TLC).

In an example, the peripheral circuit is configured to:

- in response to a programming instruction from a controller, provide program pulses to the selected word line using ISPP, so as to perform first-time programming on the memory cells of the selected memory cell row;
- provide the first preprogram pulse to the selected word line, so as to preprogram the first class of memory cells of the selected memory cell row; and
- provide program pulses to the selected word line using ISPP, so as to perform second-time programming on the memory cells of the selected memory cell row,
- wherein the number of programmed states in threshold voltage distributions of the selected memory cell row after the second-time programming is greater than the number of programmed states in threshold voltage distributions of the selected memory cell row after the first-time programming.

In an example, the memory cells in the memory device are quad-level cells (QLC).

In a second aspect, a memory system is provided, which comprises a memory device and a controller coupled to the memory device and configured to control the memory device, wherein:

- the memory device is configured to:
- provide a first preprogram pulse to a selected word line to preprogram a first class of memory cells of a selected memory cell row, wherein a target programmed state of the first class of memory cells is a first target programmed state, after provision of the first preprogram pulse a threshold voltage of the first class of memory cells is less than a first target threshold voltage, and the first target threshold voltage is a threshold voltage corresponding to the first target programmed state; and provide program pulses to the selected word line using increment step pulse programming (ISPP), so as to program memory cells of the selected memory cell row.

In an example, the controller is configured to: send a programming instruction to the memory device;

the memory device is configured to: in response to the programming instruction from the controller, provide the first preprogram pulse to the selected word line, so as to preprogram the first class of memory cells of the selected memory cell row.

In an example, the controller is configured to: send a programming instruction to the memory device;

the memory device is further configured to:

in response to the programming instruction from the controller, provide program pulses to the selected word line using ISPP, so as to perform first-time programming on the memory cells of the selected memory cell row;

provide the first preprogram pulse to the selected word line, so as to preprogram the first class of memory cells of the selected memory cell row; and provide program pulses to the selected word line using ISPP, so as to perform second-time programming on the memory cells of the selected memory cell row, wherein the number of programmed states in threshold voltage distributions of the selected memory cell row after the second-time programming is greater than the number of programmed states in threshold voltage distributions of the selected memory cell row after the first-time programming.

In an example, the memory device is further configured to:

provide a second preprogram pulse to the selected word line, so as to preprogram a second class of memory cells of the selected memory cell row, wherein a target programmed state of the second class of memory cells is a second target programmed state, after provision of the second preprogram pulse a threshold voltage of the second class of memory cells is less than a second target threshold voltage, and the second target threshold voltage is a threshold voltage corresponding to the second target programmed state.

In an example, before the provision of the first preprogram pulse, a distance between a state of the first class of memory cells and the first target programmed state is greater than a distance between a state of at least one other memory cell in the selected memory cell row and a respective target programmed state.

In an example, a difference between a voltage of the first preprogram pulse and a first target program voltage is less than a first difference threshold, and the first target program voltage is set based on a program voltage required by a programmed state of the first class of memory cells to reach the first target programmed state.

In an example, the memory device is further configured to:

determine the first preprogram pulse based on a difference between a current threshold voltage of at least one memory cell in the first class of memory cells and the first target threshold voltage.

In an example, the memory device is configured to:

if the difference between the current threshold voltage of the at least one memory cell in the first class of memory cells and the first target threshold voltage exceeds a second difference threshold, configure the first preprogram pulse for the first class of memory cells.

In an example, the memory device is configured to:

in response to a programming instruction from a controller, provide the first preprogram pulse to the selected word line, so as to preprogram the first class of memory cells of the selected memory cell row.

In an example, the memory cells in the memory device are triple-level cells (TLC).

In an example, the memory device is configured to:

in response to the programming instruction from the controller, provide program pulses to the selected word line using ISPP, so as to perform first-time programming on the memory cells of the selected memory cell row;

provide the first preprogram pulse to the selected word line, so as to preprogram the first class of memory cells of the selected memory cell row; and provide program pulses to the selected word line using ISPP, so as to perform second-time programming on the memory cells of the selected memory cell row, wherein the number of programmed states in threshold voltage distributions of the selected memory cell row after the second-time programming is greater than the number of programmed states in threshold voltage distributions of the selected memory cell row after the first-time programming.

In an example, the memory cells in the memory device are quad-level cells (QLC).

In a third aspect, an operation method of a memory device is provided, which comprises:

providing a first preprogram pulse to a selected word line to preprogram a first class of memory cells of a selected memory cell row, wherein a target programmed state of the first class of memory cells is a first target programmed state, after provision of the first preprogram pulse a threshold voltage of the first class of memory cells is less than a first target threshold voltage, and the first target threshold voltage is a threshold voltage corresponding to the first target programmed state; and providing program pulses to the selected word line using increment step pulse programming (ISPP), so as to program memory cells of the selected memory cell row.

In an example, before the providing the program pulse to the selected word line using the increment step pulse programming (ISPP), so as to program the memory cells of the selected memory cell row, the method further comprises:

providing a second preprogram pulse to the selected word line, so as to preprogram a second class of memory cells of the selected memory cell row, wherein a target programmed state of the second class of memory cells is a second target programmed state, after provision of the second preprogram pulse a threshold voltage of the second class of memory cells is less than a second target threshold voltage, and the second target threshold voltage is a threshold voltage corresponding to the second target programmed state.

In an example, before the provision of the first preprogram pulse, a distance between a state of the first class of memory cells and the first target programmed state is greater than a distance between a state of at least one other memory cell in the selected memory cell row and a respective target programmed state.

In an example, a difference between a voltage of the first preprogram pulse and a first target program voltage is less than a first difference threshold, and the first target program voltage is set based on a program voltage required by a programmed state of the first class of memory cells to reach the first target programmed state.

In an example, before the provision of the first preprogram pulse to the selected word line, the method further comprises:

determining the first preprogram pulse based on a difference between a current threshold voltage of at least one memory cell in the first class of memory cells and the first target threshold voltage.

In an example, the determining the first preprogram pulse based on the difference between the current threshold voltage of at least one memory cell in the first class of memory cells and the first target threshold voltage comprises:

if the difference between the current threshold voltage of the at least one memory cell in the first class of memory cells and the first target threshold voltage exceeds a second difference threshold, configuring the first preprogram pulse for the first class of memory cells.

In an example, the provision of the first preprogram pulse to the selected word line to preprogram the first class of memory cells of the selected memory cell row comprises:

in response to a programming instruction from a controller, providing the first preprogram pulse to the selected word line, so as to preprogram the first class of memory cells of the selected memory cell row.

In an example, the memory cells in the memory device are triple-level cells (TLC).

In an example, before the provision of the first preprogram pulse to the selected word line to preprogram the first class of memory cells of the selected memory cell row, the method further comprises:

in response to a programming instruction from a controller, providing program pulses to the selected word line using ISPP, so as to perform first-time programming on the memory cells of the selected memory cell row;

the providing the program pulse to the selected word line using the increment step pulse programming (ISPP), so as to program the selected memory cell row comprises:

providing program pulses to the selected word line using ISPP, so as to perform second-time programming on the memory cells of the selected memory cell row, wherein the number of programmed states in threshold voltage distributions of the selected memory cell row after the second-time programming is greater than the number of programmed states in threshold voltage distributions of the selected memory cell row after the first-time programming.

In an example, the memory cells in the memory device are quad-level cells (QLC).

The first class of memory cells are first programmed to the vicinity of the first target programmed state, so that the first class of memory cells can be programmed gradually to the first target programmed state during the subsequent programming using ISPP, and the $+3\sigma$ tail of the threshold voltage distribution can be improved. The first class of memory cells are first programmed to the vicinity of the first target programmed state, so that the first class of memory cells can be programmed to the first target programmed state just by injecting a small amount of electrons during the subsequent programming using ISPP, thereby reducing the IVS greatly. As such, the $-3\sigma$ tail of the threshold voltage distribution can be improved. By improving the $+3\sigma$ tail and the $-3\sigma$ tail of the threshold voltage distribution, the range of the threshold voltage distribution can be narrowed, thereby achieving the effect of increasing the read window.

BRIEF DESCRIPTION OF THE DRAWINGS

The drawings to be used in description of examples will be briefly introduced below in order to illustrate the technical solutions in the examples of the present application more clearly. Apparently, the drawings described below are only some examples of the present application. Those of ordinary skill in the art may obtain other drawings according to these drawings without creative work.

FIG. 8 is a flow diagram of an operation method of a memory device provided by examples of the present application;

FIG. 9 is a schematic diagram of a programming flow using ISPP provided by examples of the present application;

FIG. 12 is a comparative schematic diagram of pulses provided by solution one and solution two during programming processes provided by examples of the present application;

DETAILED DESCRIPTION

In order to make the purposes, technical solutions and advantages of the present application more clear, implementations of the present application will be further described below in detail in conjunction with the drawings.

Figure 1:
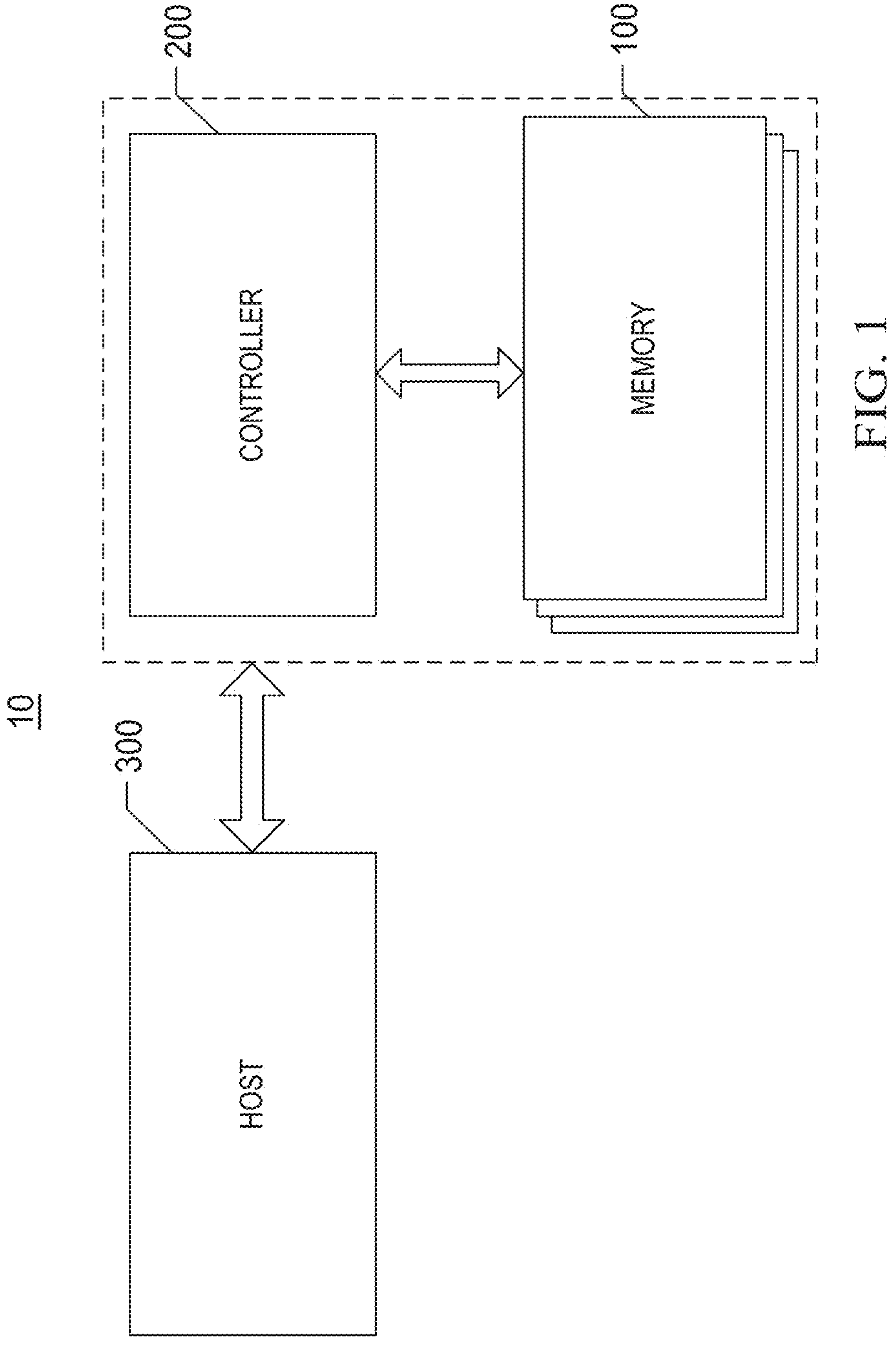
FIG. 1 is a schematic diagram of a memory system 10 provided by examples of the present application.

FIG. 1 is a schematic diagram of a memory system 10 provided by examples of the present application. As shown in FIG. 1, the memory system 10 comprises one or more memories 100, and a controller 200 coupled to the memories 100 and configured to control the memories 100.

The controller 200 may be configured to control operations performed by the memories 100, such as read, erase, and program operations. The controller 200 may be further configured to manage various functions with respect to data stored or to be stored in the memories 100, including, but not limited to bad-block management, garbage collection, logical-to-physical address translation, and wear leveling, etc. In an example, the controller 200 may be further configured to process an error correction code (ECC) with respect to data read from or written to the memories 100. The controller 200 may also perform any other suitable functions, such as, formatting the memories 100.

The controller 200 may also communicate with an external apparatus according to an example communication protocol. In an example, the controller 200 may communicate with an external apparatus through at least one of various interface protocols. The interface protocols may be a Universal Serial Bus (USB) protocol, a Multi-Media Card (MMC) protocol, a Peripheral Component Interconnect (PCI) protocol, a PCI-express (PCI-E) protocol, an Advanced Technology Attachment (ATA) protocol, a serial-ATA protocol, a parallel-ATA protocol, a Small Computer System Interface (SCSI) protocol, an Enhanced Small Drive Interface (ESDI) protocol, an Integrated Drive Electronics (IDE) protocol, and a Fire Wire protocol, etc.

In some examples, the controller 200 and one or more memories 100 may be integrated into various types of electronic apparatuses. The electronic apparatuses may be mobile phones, desktop computers, laptop computers, tablets, vehicle computers, gaming consoles, printers, pointing apparatuses, wearable electronic apparatuses, smart sensors, Virtual Reality (VR) apparatuses, Augmented Reality (AR) apparatuses, or any other suitable electronic apparatuses having storages therein. In this scenario, as shown in FIG. 1, the memory system 10 further comprises a host 300. The controller 200 is coupled to the host 300. The controller 200 can manage the data stored in the memories 100 and communicate with the host 300 to achieve functions of the above electronic apparatuses.

In some other examples, the controller 200 and one or more memories 100 may be integrated into various types of memory devices.

Figure 2:
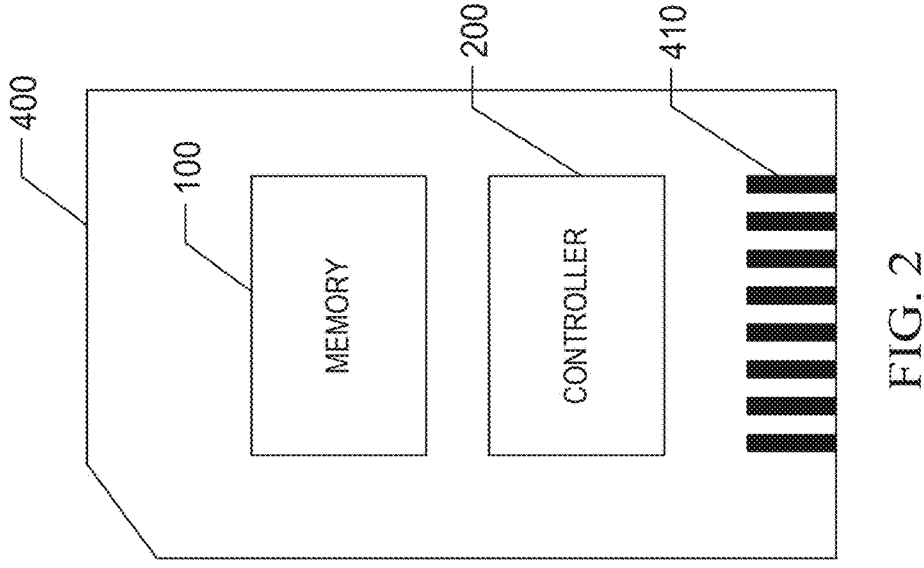
FIG. 2 is a schematic diagram of a memory device provided by examples of the present application.

As an example, as shown in FIG. 2, the controller 200 and a single memory device 100 may be integrated into a memory card 400. The memory card 400 may include a Personal Computer Memory Card International Association (PCMCIA, PC) card, a Compact Flash (CF) card, a Smart Media (SM) card, a memory stick, a Multi-Media Card (MMC), a reduced size MMC (RS-MMC), a micro-MMC, a Secure Digital (SD) card, and a Universal Flash Storage (UFS) card, etc. As shown in FIG. 2, the memory card 400 may also comprise a connector 410 coupling the memory card 400 with the host.

Figure 3:
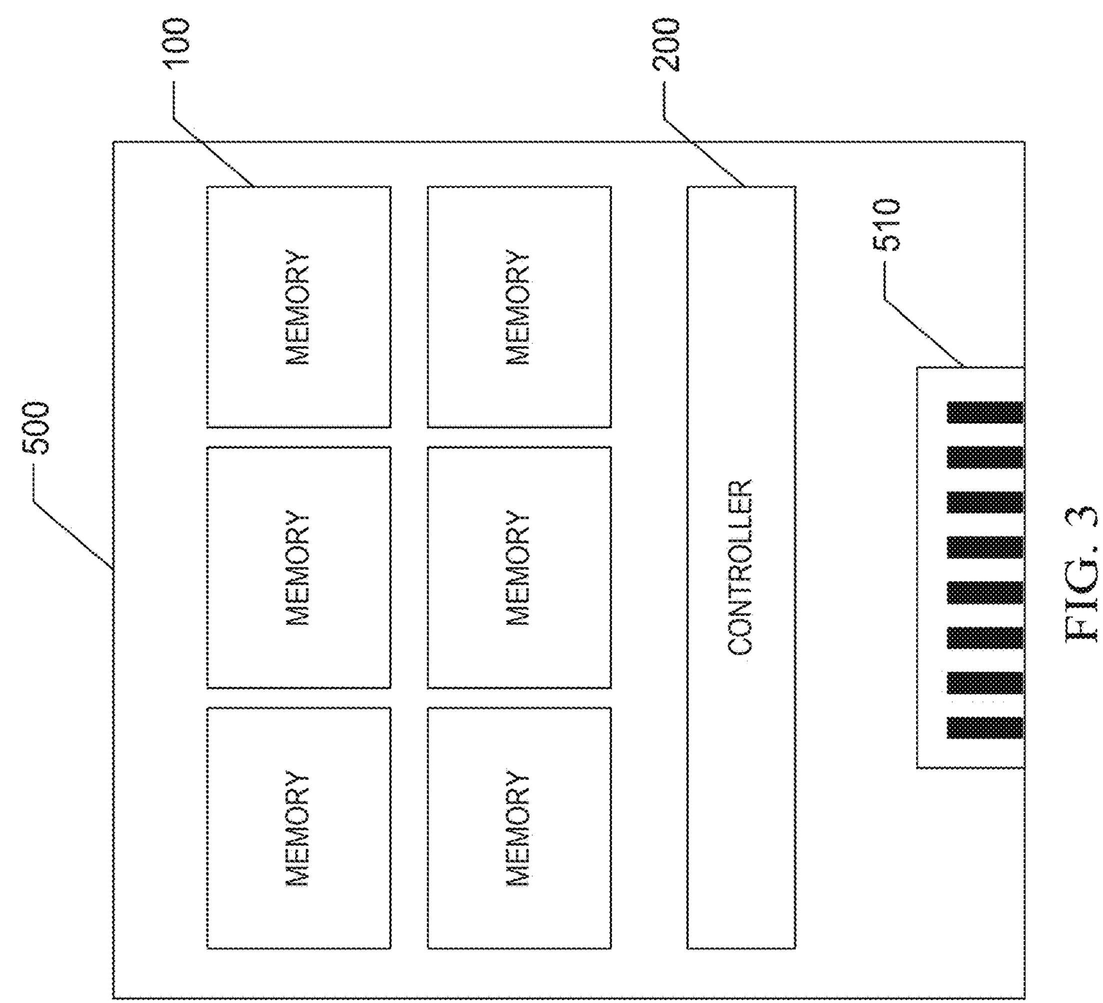
FIG. 3 is a schematic diagram of another memory device provided by examples of the present application.

As another example, as shown in FIG. 3, the controller 200 and a plurality of memories 100 may be integrated into a Solid State Disk (SSD) 500. The solid state disk 500 may also comprise a connector 510 coupling the solid state disk 500 with the host. A storage capacity and/or an operation speed of the solid state disk 500 are greater than a storage capacity and/or an operation speed of the memory card 400.

In addition, the memories 100 in FIG. 1 to FIG. 3 may be any memories involved in the examples of the present application. For example, they may be 3D NAND (NAND gate) memories. A structure of the memory device 100 is explained and illustrated below.

Figure 4:
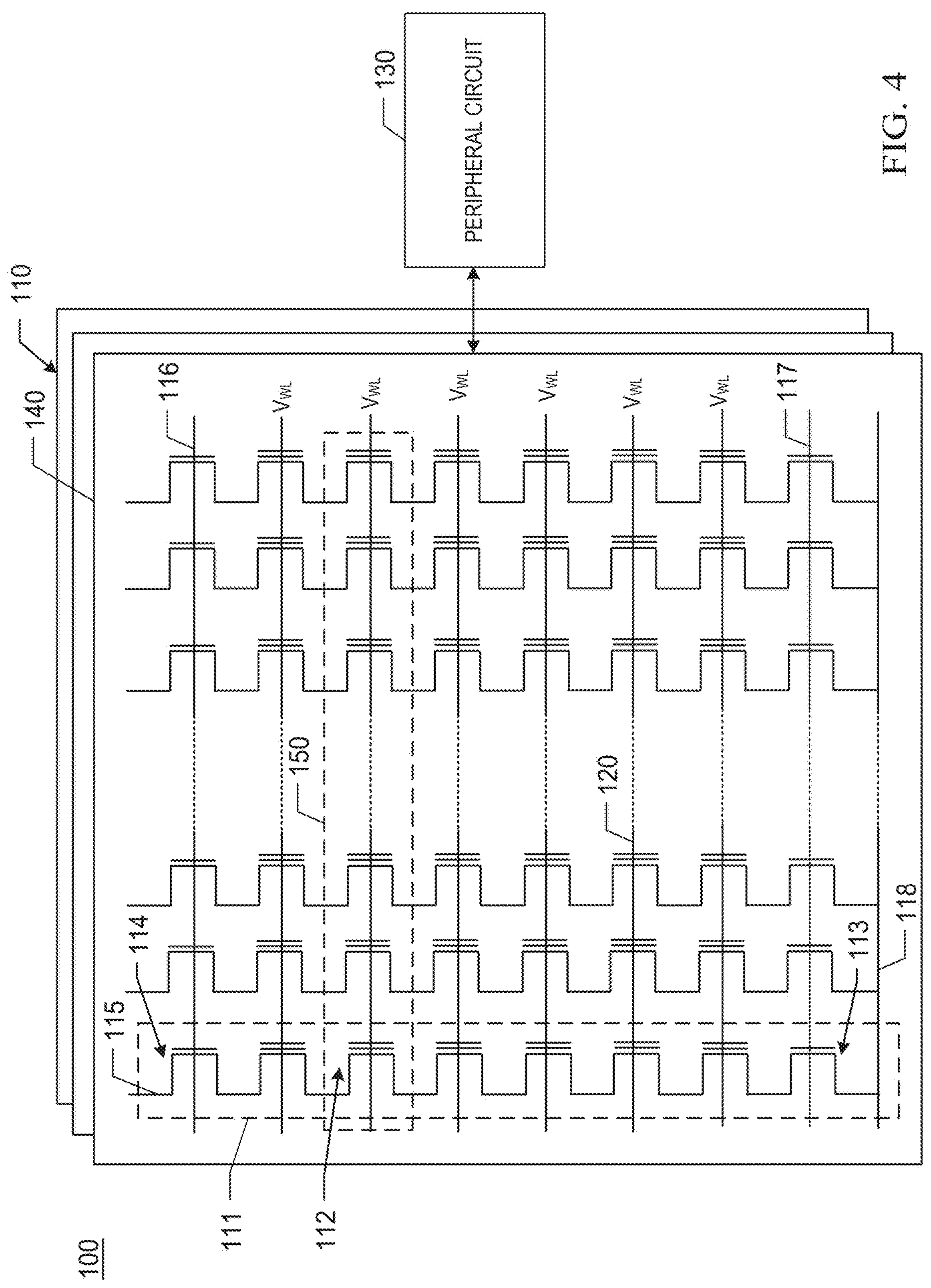
FIG. 4 is a schematic diagram of a memory device 100 provided by examples of the present application.

FIG. 4 is a schematic diagram of the memory device 100 provided by examples of the present application. As shown in FIG. 4, the memory device 100 comprises:

- a memory array 110 comprising a plurality of memory cell rows;
- a plurality of word lines 120 coupled to the plurality of memory cell rows respectively; and
- a peripheral circuit 130 coupled to the plurality of word lines 120 and configured to perform operations such as a program (e.g., data write) operation or a data read operation etc. on a selected memory cell row in the plurality of memory cell rows, the selected memory cell row being a memory cell row coupled with a selected word line, wherein in order to perform operations such as the program operation or data read operation etc., the peripheral circuit 130 is configured to perform an operation method of the memory (memory device) provided by the examples of the present application.

The memory array 110 may be a NAND flash memory array. As shown in FIG. 1, the NAND flash memory array comprises a plurality of memory strings 111 which are arranged on a substrate in an array and each memory string 111 extends vertically above the substrate (not shown). In some examples, each memory string 111 comprises a plurality of memory cells 112 coupled in series and stacked vertically.

As shown in FIG. 4, each memory string 111 may further comprise a source select gate (SSG) 113 at the bottom and a drain select gate (DSG) 114 at the top. The source select gate is also referred to as a lower select transistor, a bottom select gate (BSG), or a source select transistor, and the drain select gate is also referred to as an upper select transistor, a top select gate (TSG), or a drain select transistor. The source select gate 113 and the drain select gate 114 may be configured to activate a selected memory string 111 during read and program operations.

In some examples, the drain select gate 114 of each memory string 111 is coupled to a respective bit line 115 which data can be read from or written to via an output bus (not shown).

In some examples, each memory string 111 is configured to be selected or deselected by applying a select voltage (e.g., above a threshold voltage of a transistor having the drain select gate 114) or a deselect voltage (e.g., 0 V) to the respective drain select gate 114 via one or more DSG lines 116, and/or in some examples, each memory string 111 is configured to be selected or deselected by applying a select voltage (e.g., above a threshold voltage of a transistor having the source select gate 113) or a deselect voltage (e.g., 0 V) to the respective source select gate 113 via one or more SSG lines 117.

As shown in FIG. 4, the memory strings 111 may be organized into a plurality of blocks 140. For any one of the plurality of blocks 140, the block 140 may have one source line (SL) 118, and sources of all the memory strings 111 in the block 140 are coupled through the source line 118, which is also referred to as a common source line or an array common source (ACS).

The source line 118 may be used to be grounded, so as to achieve grounding of sources of various memory cells of the memory strings in the block 140 in some subsequent operations. In an example, the sources of the various memory cells of the memory strings in the block 140 may be also connected with a high voltage through the source line 118 in some other operations.

Each block 140 is a basic data unit for an erase operation, that is, all the memory cells 112 on the same block 140 are erased at the same time. To erase the memory cells 112 in a selected block, the source line coupled to the selected block can be biased with an erase voltage (Vers) (e.g., a high positive voltage (20 V or more)).

It is to be understood that in some other examples, an erase operation may be performed at a half-block level, a quarter-block level, or a level having any suitable number of blocks or any suitable fractions of a block.

As shown in FIG. 4, the same layer of memory cells 112 of adjacent memory strings 111 in the same block 140 can be coupled through a word line 120, wherein the word line 120 is to select which layer of memory cells 112 in the block 140 to be impacted by read and program operations.

In some examples, each word line 120 is coupled to a page 150 to which the memory cells 112 pertain. A size of the page 150 may be related to the number of the memory strings 111 coupled by the word line 120 in one block 140. Each word line 120 may be coupled with a control gate (e.g., a gate electrode) of each memory cell 112 in the respective page 150. It can be understood that one memory cell row refers to a plurality of memory cells 112 on the same page 150.

It is to be noted that the same layer of memory cells in one block 140 corresponds to the same word line, but the same layer of memory cells may be divided into one or more pages. That is, one word line can be coupled to one or more pages, e.g., to one page for an SLC, and to two pages for an MLC.

Figure 5:
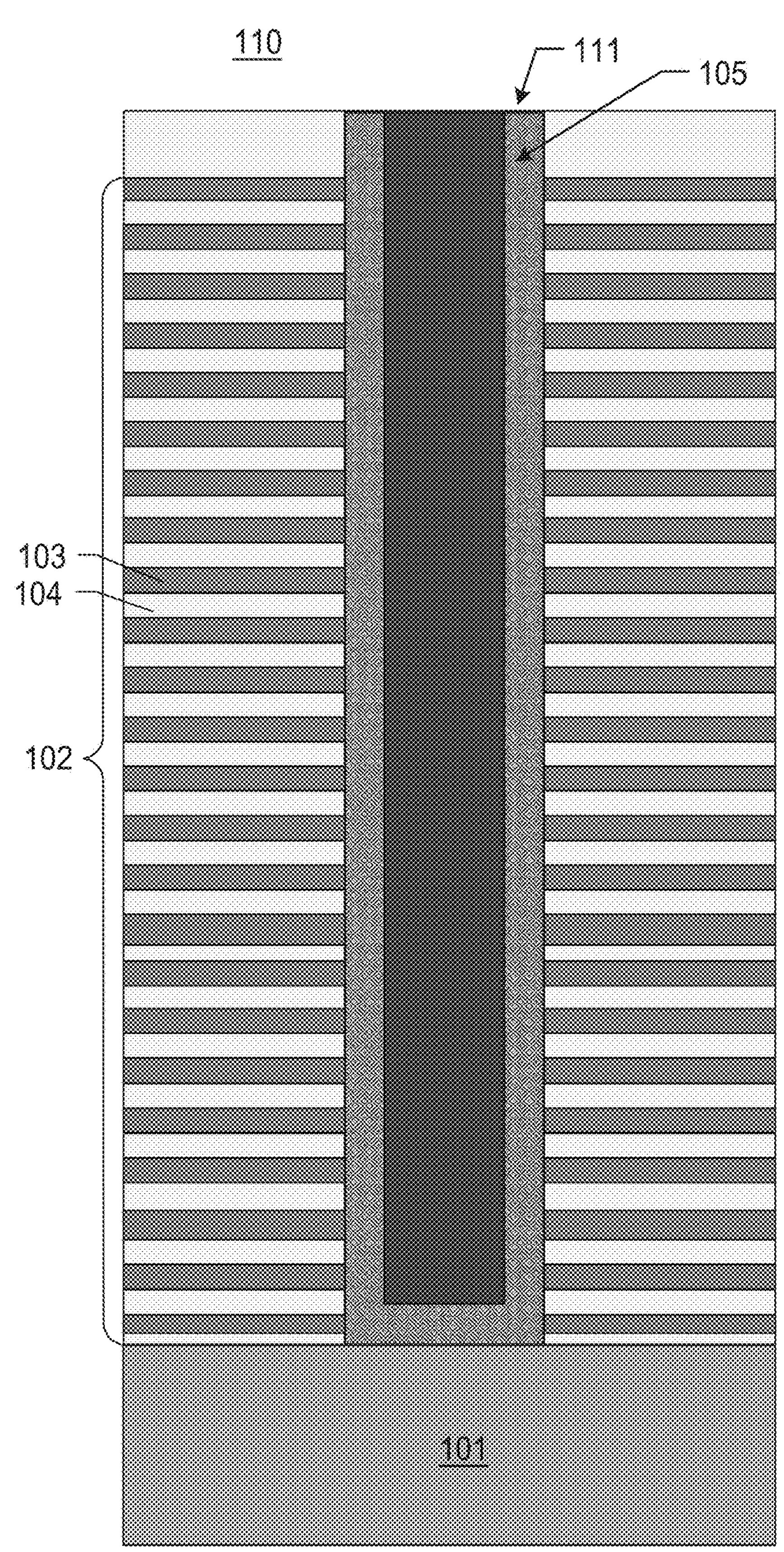
FIG. 5 is a sectional schematic diagram of a memory array 110 comprising a memory string 111 provided by examples of the present application.

FIG. 5 is a sectional schematic diagram of a memory array 110 comprising a memory string 111 provided by examples of the present application. As shown in FIG. 5, the memory string 111 may extend vertically above a substrate 101 and penetrate through a stack layer 102. The substrate 101 may include silicon (e.g., monocrystalline silicon), silicon germanium (SiGe), gallium arsenide (GaAs), germanium (Ge), silicon on insulator (SOI), germanium on insulator (GOI), or any other suitable materials.

The stack layer 102 may comprise alternate gate conductive layers 103 and gate-to-gate dielectric layers 104. The number of pairs of the gate conductive layers 103 and the gate-to-gate dielectric layers 104 in the stack layer 102 may determine the number of the memory cells 112 in the memory array 110.

The gate conductive layers 103 may include conductive materials including, but not limited to, tungsten (W), cobalt (Co), copper (Cu), aluminum (Al), polysilicon, doped silicon, silicides, or any combination thereof. In some examples, each gate conductive layer 103 comprises a metal layer, e.g., a tungsten layer. In some other examples, each gate conductive layer 103 comprises a doped polysilicon layer. Furthermore, each gate conductive layer 103 may comprise a control gate around a memory cell 112, and can extend laterally at the top of the stack layer 102 as a DSG line 116, at the bottom of the stack layer 102 as an SSG line 117, or between the DSG line 116 and the SSG line 117 as the word line 120.

As shown in FIG. 5, the memory string 111 comprises a channel structure 105 extending vertically and penetrating through the stack layer 102. In some examples, the channel structure 105 comprises channel holes filled with (one or more) semiconductor materials (e.g., as a semiconductor channel) and (one or more) dielectric materials (e.g., as a memory film). The semiconductor channel includes silicon, e.g., polysilicon. The memory film is a composite dielectric layer comprising a tunneling layer, a storage layer (also referred to as a "charge trap/storage layer"), and a blocking layer.

In some examples, the channel structure 105 has a cylindrical shape (e.g., a pillar shape). Various layers in the semiconductor channel and the memory film are arranged radially from the center of the cylinder to the external surface of the cylinder in this sequence.

It is to be understood that, although not shown in FIG. 5, the memory array 110 may further comprise other additional components, including, but not limited to a gate line slit/source contact, a local contact, and an interconnect layer, etc.

Referring back to FIG. 4, the peripheral circuit 130 may be coupled to the memory array 110 through the bit line 115, the word line 120, the source line 118, the SSG line 117, and the DSG line 116. The peripheral circuit 130 may comprise any suitable analog, digital, and hybrid signal circuits for facilitating operations of the memory array 110 by applying and sensing voltage signals and/or current signals to and from the memory cells 112 via the bit line 115, the word line 120, the source line 118, the SSG line 117, and the DSG line 116.

Figure 6:
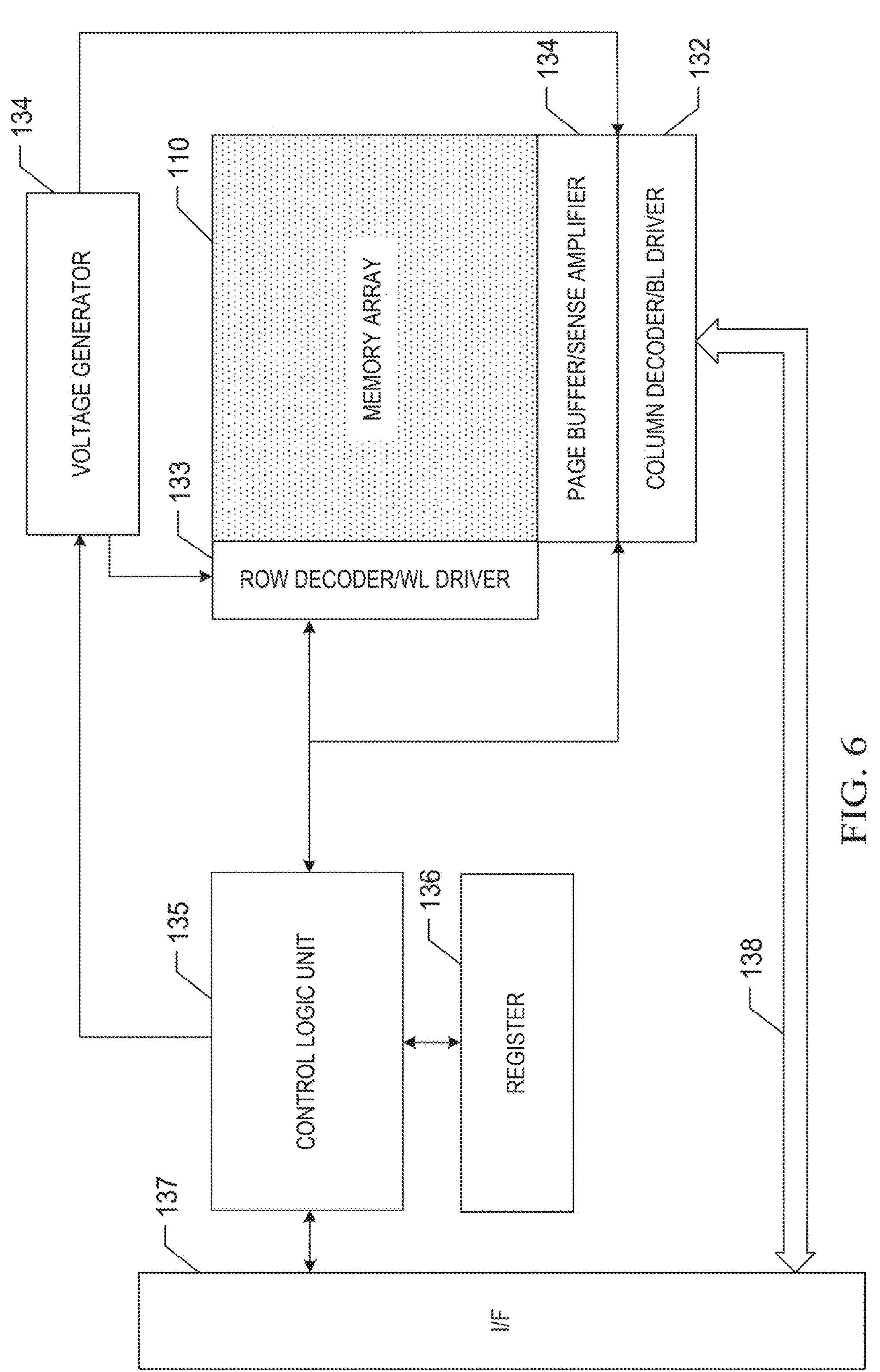
FIG. 6 is a schematic diagram of a peripheral circuit provided by examples of the present application.

The peripheral circuit 130 may include various types of peripheral circuits formed using a metal-oxide-semiconductor (MOS) technology. For example, FIG. 6 illustrates some example peripheral circuits. The peripheral circuit 130 comprises a page buffer/sense amplifier 131, a column decoder/bit line (BL) driver 132, a row decoder/word line (WL) driver 133, a voltage generator 134, a control logic unit 135, a register 136, an interface 137, and a data bus 138. It is to be understood that in some examples, additional peripheral circuits not shown in FIG. 6 may be included as well.

The page buffer/sense amplifier 131 may be configured to read and program (write) data from and to the memory array 110 according to control signals from the control logic unit 135. For instance, the page buffer/sense amplifier 131 may store one page of program data (write data) to be programmed into the memory array 110. The page buffer/sense amplifier 131 may also perform a verify operation to ensure that the data has been properly programmed into the memory cells 112 with which the selected word line 120 is coupled. The page buffer/sense amplifier 131 may also sense a low power signal from the bit line 115 that represents a data bit stored in a memory cell 112, and amplify a small voltage swing to a recognizable logic level in a read operation.

The column decoder/bit line driver 132 may be configured to be controlled by the control logic unit 135 and select one or more memory strings 111 by applying bit line voltages generated from the voltage generator 134.

The row decoder/word line driver 133 may be configured to be controlled by the control logic unit 135 and select/deselect the block 140 of the memory array 110 and select/deselect the word line 120 of the block 140. The row decoder/word line driver 133 may be further configured to drive the word line 120 using a word line voltage (VWL) generated from the voltage generator 134. In some examples, the row decoder/word line driver 133 may also select/deselect and drive the SSG line 117 and the DSG line 116. As described below in detail, the row decoder/word line driver 133 is configured to perform an erase operation on the memory cells 112 coupled to (one or more) selected word lines 120.

The voltage generator 134 may be configured to be controlled by the control logic unit 135 and generate a word line voltage (such as a read voltage, a program voltage, a pass voltage, a local voltage, and a verify voltage, etc.), a bit line voltage, and a source line voltage, etc. to be supplied to the memory array 110.

The control logic unit 135 may be coupled to each of the peripheral circuits described above and configured to control operations of each circuit.

The register 136 may be coupled to the control logic unit 135 and may include a state register, a command register, and an address register for storing state information, command operation codes (OP codes), and command addresses for controlling the operations of each of the peripheral circuits.

The interface (I/F) 137 may be coupled to the control logic unit 135, and act as a control buffer to buffer and relay control commands received from a host (not shown) to the control logic unit 135 and state information received from the control logic unit 135 to the host. The interface 137 may also be coupled to the column decoder/bit line driver 132 via the data bus 138 and act as a data I/O interface and a data buffer to buffer and relay data to and from the memory array 110.

The above description of the hardware examples related to the memory has advantageous effects similar to those of method examples below. Technical details not disclosed in the relevant hardware examples of the memory may be understood with reference to the description of the method examples of the present application.

In the above FIG. 1 to FIG. 6, a memory cell 112 may be either a floating gate memory cell comprising a floating gate transistor, or a charge trap memory cell comprising a charge trap transistor. When these types of memory cells store different data, numbers of electrons trapped in the memory cells are different, resulting in different threshold voltages of the memory cells. On that basis, the amount of data stored in the memory cells is determined subsequently by determining the threshold voltages of the memory cells. The memory cells are in different states when storing different data, that is, the memory cells correspond to different states indicating that the memory cells store different data.

In some examples, a memory cell 112 may be Single-Level Cell (SLC). A SLC has two possible states for storing one bit of data, which is 0 or 1 respectively, wherein a state corresponding to stored data 1 is referred to as an erased state and a state corresponding to stored data 0 is referred to as a programmed state.

In some other examples, a memory cell 112 may be Multi-Level Cell (MLC). A MLC has four possible states for storing two bits of data, which are 00, 01, 10, or 11 respectively, wherein a state corresponding to stored data 11 is referred to as an erased state and states corresponding to stored data 00, 01, and 10 are referred to as programmed states. That is, a MLC has one erased state and three programmed states.

In some other examples, a memory cell 112 may be Triple-Level Cell (TLC). A TLC has eight possible states for storing three bits of data, which are 000, 100, 010, 001, 110, 101, 011, or 111 respectively, wherein a state corresponding to stored data 111 is referred to as an erased state and states corresponding to storage of the other seven pieces of data are referred to as programmed states. That is, a TLC has one erased state and seven programmed states.

In some other examples, a memory cell 112 may be Quad-Level Cell (QLC). A QLC has sixteen possible states for storing four bits of data, which are no longer illustrated one by one via examples. A state corresponding to stored data 1111 is referred to as an erased state and states corresponding to the other fifteen pieces of stored data are referred to as programmed states. That is, a QLC has one erased state and fifteen programmed states.

Figure 7:
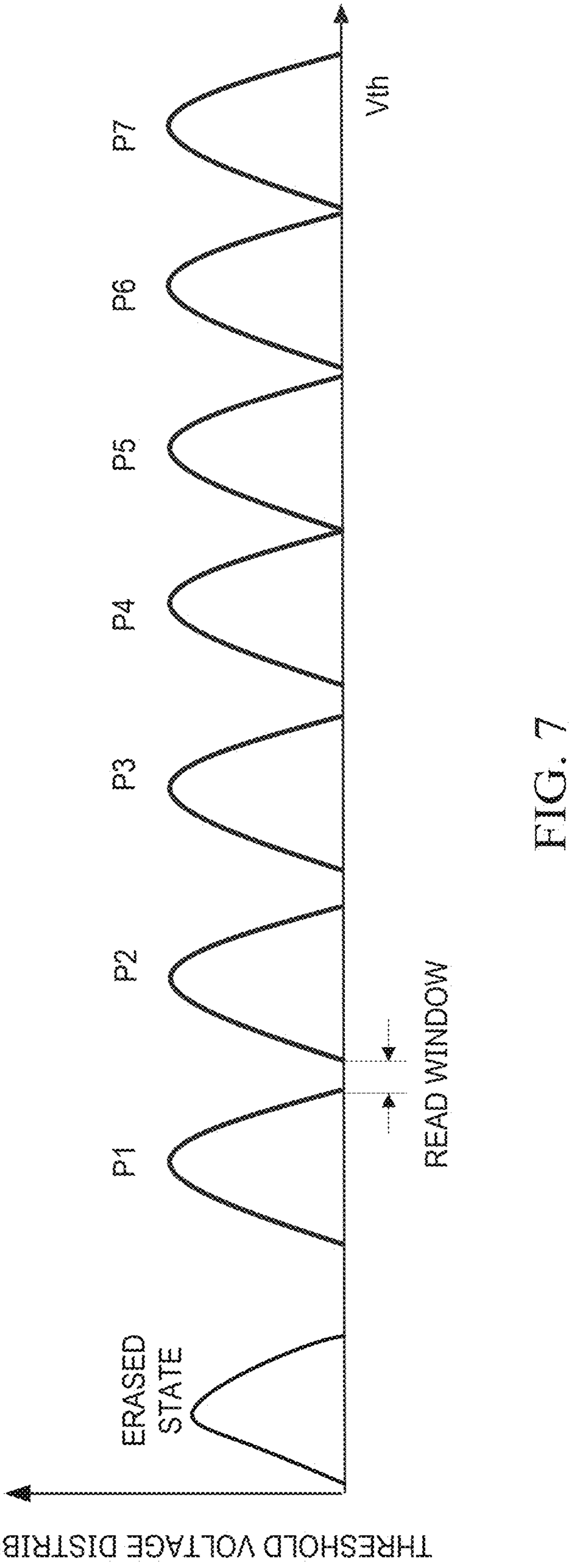
FIG. 7 is a schematic diagram of threshold voltage distributions of TLCs provided by examples of the present application.

FIG. 7 is a schematic diagram of threshold voltage distributions of the TLCs provided by examples of the present application. As shown in FIG. 7, the TLCs comprise eight states from left to right, wherein a leftmost one is the erased state followed by seven programmed states, which are labeled as P1 to P7 in order.

As shown in FIG. 7, each programmed state corresponds to a threshold voltage (Vth) range. During programming, if a threshold voltage of a memory cell falls within a threshold voltage range corresponding to a certain programmed state, it indicates that the memory cell currently reaches the programmed state. On that basis, during data reading, a programmed state corresponding to the memory cell is determined based on the threshold voltage of the memory cell, e.g., reading data stored in the memory cell.

In addition, as shown in FIG. 7, a distance between a right boundary of a left programmed state and a left boundary of a right programmed state in two adjacent ones of the programmed states may be referred to as a read window. After the memory is programmed, a larger read window between the two adjacent ones of the programmed states is more favorable to subsequent data reading.

On that basis, examples of the present application provide an operation method of a memory. Through the operation method provided by the examples of the present application, the read window between the two adjacent ones of the programmed states after the programming can be increased.

The operation method of a memory provided by the examples of the present application is explained and illustrated below.

FIG. 8 is a flow diagram of an operation method of a memory provided by examples of the present application. The method is applied to the peripheral circuit of the memory shown in FIGS. 1-6, and in an example, applied to the control logic unit in the peripheral circuit. Explanation and illustration in the examples below are performed using the peripheral circuit as an execution subject. As shown in FIG. 8, the method comprises the following operations.

Operation 801: Provide a first preprogram pulse to a selected word line to preprogram a first class of memory cells of a selected memory cell row, wherein a target programmed state of the first class of memory cells is a first target programmed state, after provision of the first preprogram pulse a threshold voltage of the first class of memory cells is less than a first target threshold voltage, and the first target threshold voltage is a threshold voltage corresponding to the first target programmed state.

The first class of memory cells may be understood as: a set of a plurality of memory cells in the selected memory cell row whose target programmed state is the first target programmed state.

The first target threshold voltage may be understood as: a statistical result of various threshold voltages in a threshold voltage distribution corresponding to the first target programmed state, wherein the statistical result may be an average value of the various threshold voltages, or a maximum value of the various threshold voltages, or a minimum value of the various threshold voltages, etc. It is to be noted that in the examples of the present application, for different target programmed states, target threshold voltages corresponding to the target programmed states are determined in the same way. For example, an average value of various threshold voltages in a threshold voltage distribution corresponding to a target programmed state is used as a target threshold voltage.

After the first preprogram pulse is provided to the selected word line to preprogram the first class of memory cells, a threshold voltage of the first class of memory cells is less than the first target threshold voltage, that is, a current state of the first class of memory cells has not reached the first target programmed state yet. Preprogramming the first class of memory cells necessarily causes the threshold voltage of the first class of memory cells to be shifted towards the first target threshold voltage. In other words, a distance between the state of the first class of memory cells after the provision of the first preprogram pulse and the first target programmed state is less than a distance between a state of the first class of memory cells before the provision of the first preprogram pulse and the first target programmed state. Therefore, after the first preprogram pulse is provided to preprogram the first class of memory cells, the threshold voltage of the first class of memory cells is closer to the first target threshold voltage, that is, the current state of the first class of memory cells is closer to the first target programmed state.

Operation 802: Provide program pulses to the selected word line using ISPP, so as to program memory cells of the selected memory cell row.

FIG. 9 is a schematic diagram of a programming flow using increment step pulse programming (ISPP) provided by examples of the present application. As shown in FIG. 9, the programming flow comprises: gradually providing a series of program pulses (PPs) of gradually increased amplitudes to the selected word line. A voltage amplitude of a program pulse provided at the first time is VPGM-START, and an increment of each step of the program pulses is ΔISPP. The VPGM-START, ΔISPP, and a maintenance duration of a single program pulse can be preconfigured. After provision of the program pulse at each time, whether a memory cell in the selected memory cell row reach the target programmed state may be verified, that is, a program verify (PV) operation is performed on the memory cell, wherein the PV operation is realized by providing one or more PV pulses, which are not shown in FIG. 9. If a memory cell does not reach the respective target programmed state, the verification of the memory cell continues after the provision of the program pulse at a next time, until the memory cell reaches the target programmed state, and then programming of the memory cell terminates.

For ease of subsequent illustration, a process of programming the memory cells of the selected memory cell row using ISPP is referred to as ISPP programming for short.

In the examples of the present application, prior to programming the memory cells of the selected memory cell row using ISPP, the first preprogram pulse corresponding to the first target programmed state is provided, so that the state of the first class of memory cells in the selected memory cell row whose target programmed state is the first target programmed state can reach the vicinity of the first target programmed state. The following technical effects can be achieved through such programming.

On the one hand, the first class of memory cells are first programmed to the vicinity of the first target programmed state, so that the first class of memory cells can be programmed gradually to the first target programmed state during the subsequent programming using ISPP, thereby avoiding too fast programming. As such, a +3σ tail of the threshold voltage distribution can be improved.

On the other hand, the first class of memory cells are first programmed to the vicinity of the first target programmed state, so that the first class of memory cells can be programmed to the first target programmed state just by injecting a small amount of electrons during the subsequent programming using ISPP, thereby greatly reducing initial threshold voltage shift (initial Vt shift, IVS). As such, a −3σ tail of the threshold voltage distribution can be improved.

By improving the +3σ tail and the −3σ tail of the threshold voltage distribution, a range of the threshold voltage distribution can be narrowed, thereby achieving an effect of increasing the read window.

As shown in FIG. 7, a threshold voltage distribution corresponding to any programmed state typically presents a normal distribution, and σ above may be understood as a standard deviation of the normal distribution. Accordingly, the +3σ tail of the threshold voltage distribution may be understood as: data in the normal distribution located in a right side to $\mu+3\sigma$, wherein μ is a symmetry axis of the normal distribution. Improving the +3σ tail of the threshold voltage distribution may be understood as: making the data in the normal distribution located in the right side to $\mu+3\sigma$ as less as possible.

Accordingly, the −3σ tail of the threshold voltage distribution may be understood as: data in the normal distribution located in a left side to $\mu-3\sigma$. Improving the −3σ tail of the threshold voltage distribution may be understood as: making the data in the normal distribution located in the left side to $\mu-3\sigma$ as less as possible.

Figure 10:
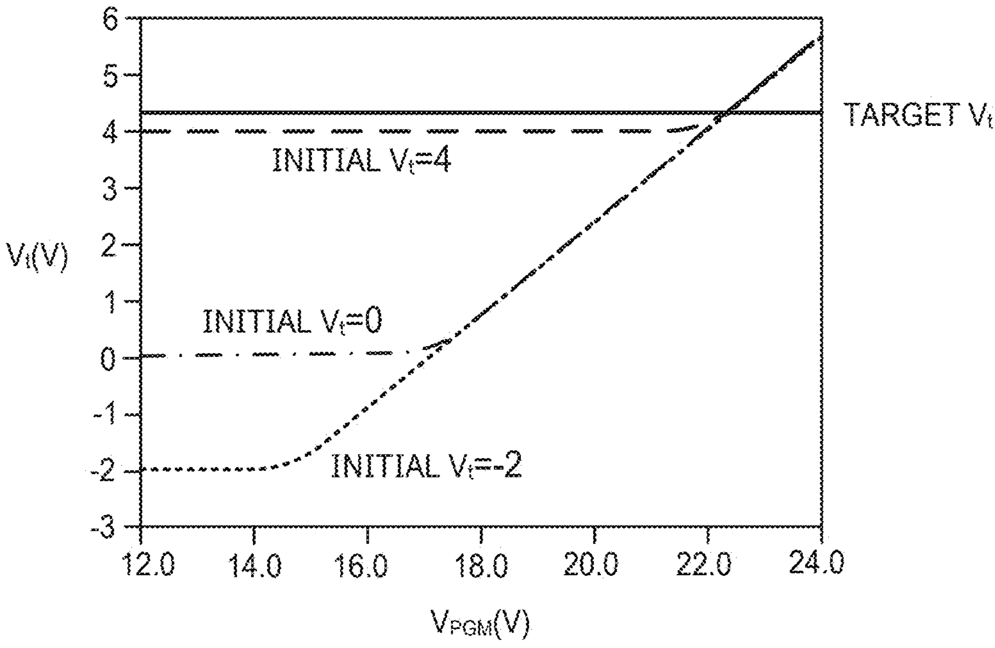
FIG. 10 is a schematic diagram of a correspondence between a program voltage (VPGM) and a threshold voltage (Vt) of a memory cell in a programming process provided by examples of the present application.

FIG. 10 is a schematic diagram of a correspondence between a program voltage (VPGM) and a threshold voltage (Vt) of a memory cell in a programming process provided by examples of the present application. A slope in FIG. 10 can represent the programming speed. As shown in FIG. 10, when an initial threshold voltage of a memory cell is closer to the target threshold voltage, the programming speed is smaller. As such, preprogramming the first class of memory cells to the vicinity of the first target programmed state before ISPP programming can improve the +3σ tail of the threshold voltage distribution corresponding to the first target programmed state.

Figure 11:
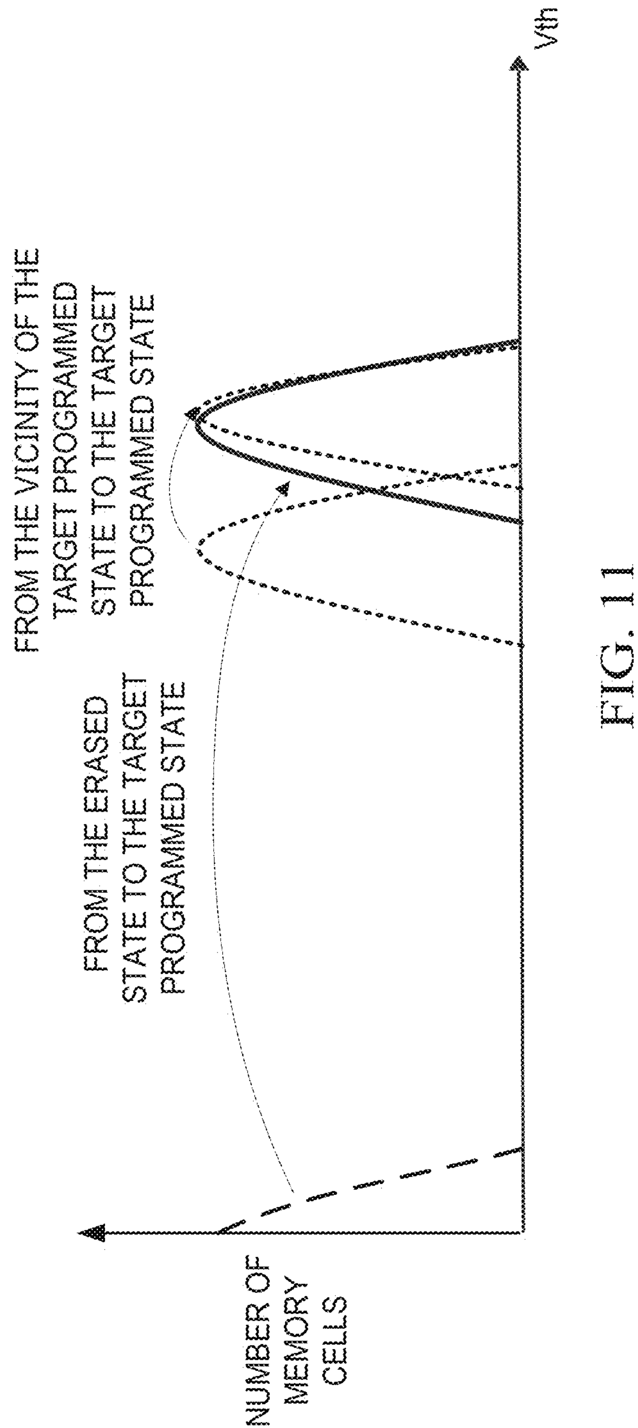
FIG. 11 is a schematic diagram of improving a $-3\sigma$ tail of a threshold voltage distribution provided by examples of the present application.

FIG. 11 is a schematic diagram of improving the −3σ tail of the threshold voltage distribution provided by examples of the present application. As shown in FIG. 11, in one way of programming, the memory cells are programmed directly from an erased state to the target programmed state through the ISPP programming; in the other way of programming, the memory cells are first programmed from the erased state to the vicinity of the target programmed state through preprogramming, and then the memory cells are programmed from the vicinity of the target programmed state to the target programmed state through the ISPP programming. A threshold voltage distribution obtained by ISPP direct program is shown by a solid line on the right side of FIG. 11, and a threshold voltage distribution obtained by preprogramming followed by ISPP programming is shown by a dashed line on the right side of FIG. 11. As shown in FIG. 11, a −3σ tail of the threshold voltage distribution obtained by preprogramming followed by ISPP programming is significantly shorter than a −3σ tail of the threshold voltage distribution obtained by ISPP direct programming.

In some examples, before the provision of the first preprogram pulse, the distance between the state of the first class of memory cells and the first target programmed state is greater than a distance between a state of at least one other memory cell in the selected memory cell row and a respective target programmed state.

In other words, the memory cells whose current state is far away from the target programmed state are preprogrammed, prior to the ISPP programming. When the current state is farther from the target programmed state, the IVS during the ISPP programming process is more severe. Therefore, after the memory cells whose current state is far away from the target programmed state are preprogrammed, the IVS during the subsequent ISPP programming process can be improved.

The distance between the state of a memory cell and the respective target programmed state may be understood as: a distance between the threshold voltage of the memory cell and the threshold voltage distribution corresponding to the respective target programmed state. For example, in FIG. 7, the distance between the state of a memory cell and the respective target programmed state may be: a distance between the threshold voltage of the memory cell and a central axis or left boundary of the threshold voltage distribution corresponding to the respective target programmed state.

In an example, in a scenario where the erased state and programmed state are named using consecutive numbers, the distance between the state of a memory cell and the respective target programmed state may be understood as: a difference between a number corresponding to the current state of the memory cell and a number corresponding to the respective target programmed state.

For example, for the threshold voltage distributions shown in FIG. 7, assuming that the erased state is labeled as P0 and the seven programmed states are labeled as P1 to P7 sequentially, the distance between the state of a memory cell and the target programmed state may be determined via the distance between the threshold voltage of the memory cell and the threshold voltage distribution corresponding to the respective target programmed state, or via the difference between the number corresponding to the current state of the memory cell and the corresponding target programmed state and the number corresponding to the respective target programmed state.

On that basis, for the threshold voltage distributions of the TLCs shown in FIG. 7, before the TLCs are programmed, all the memory cells are in the erased state. In this scenario, the first class of memory cells may be a class of memory cells whose target programmed state is P7.

Additionally, in some examples, a difference between a voltage of the first preprogram pulse and a first target program voltage is less than a first difference threshold, and the first target program voltage is set based on a program voltage required by a programmed state of the first class of memory cells to reach the first target programmed state.

The first difference threshold is a small value, so that the voltage of the first preprogram pulse is close to the first target program voltage. As such, the state of the first class of memory cells after the preprogramming is close to the first target programmed state.

An implementation of setting the first target program voltage based on the program voltage required by the programmed state of the first class of memory cells to reach the first target programmed state may be: a setting performed by a technician based on voltages of history program pulses provided through ISPP programming of the first class of memory cells. For example, a maximum value in the voltages of the history program pulses provided through the ISPP programming of the first class of memory cells may be used as the first target program voltage. Alternatively, several large voltages in the voltages of the history program pulses provided through the ISPP programming of the first class of memory cells may be selected first, and then an average value of these several large voltages is used as the first target program voltage. The examples of the present application do not limit the way of determining the first target program voltage, which are no longer illustrated here one by one via examples.

Since target programmed states of various memory cells in the selected memory cell row are different, before provision of the preprogram pulse, the first class of memory cells requiring the preprogramming may be selected from the selected memory cell row.

In some examples, an implementation of selecting the first class of memory cells requiring the preprogramming from the selected memory cell row may be: determining the first preprogram pulse based on a difference between a current threshold voltage of at least one memory cell in the first class of memory cells and the first target threshold voltage.

Based on the above content, it can be seen that in the examples of the present application, the memory cells whose current state is far away from the target programmed state may be preprogrammed prior to the ISPP programming. Therefore, in some examples, whether the first preprogram pulse is configured for the first class of memory cells may be determined based on a difference between a current threshold voltage of at least one memory cell in the first class of memory cells and the first target threshold voltage.

In an example, if the difference between the current threshold voltage of the at least one memory cell in the first class of memory cells and the first target threshold voltage exceeds a second difference threshold, the first preprogram pulse is configured for the first class of memory cells.

The second difference threshold is a preset value, which may be set by a technician based on experience. If the difference between the current threshold voltage of the at least one memory cell in the first class of memory cells and the first target threshold voltage exceeds the second difference threshold, it indicates that the current state of the first class of memory cells is far away from the target programmed state, and thus the first preprogram pulse may be configured for the first class of memory cells.

Accordingly, if the difference between the current threshold voltage of the at least one memory cell in the first class of memory cells and the first target threshold voltage does not exceed the second difference threshold, it indicates that the current state of the first class of memory cells is close to the target programmed state, and thus there is no need to configure the first preprogram pulse for the first class of memory cells.

In an example, for different classes of memory cells corresponding to different target programmed states in the selected memory cell row, a difference between a current threshold voltage of each class of memory cells and a target threshold voltage of a respective target programmed state may be also determined respectively, and then multiple classes of memory cells are sorted in a descending order of determined differences. A class of memory cells ranked first in a sorting result is selected as the first class of memory cells, and the first preprogram pulse is configured for the first class of memory cells.

The current threshold voltage of each class of memory cells may be understood as an average value or other statistical results of threshold voltages of the various memory cells in this class of memory cells.

As stated above, the first class of memory cells whose programmed state is the first target programmed state are preprogrammed prior to the ISPP programming, so as to improve $\pm 3\sigma$ tails of the threshold voltage distribution corresponding to the first target programmed state. In the examples of the present application, a second class of memory cells whose programmed state is a second target programmed state may be also preprogrammed prior to the ISPP programming, so as to improve ±3σ tails of a threshold voltage distribution corresponding to the second target programmed state.

On that basis, in some examples, before operation 802, a second preprogram pulse is provided to the selected word line to preprogram the second class of memory cells of the selected memory cell row, wherein a target programmed state of the second class of memory cells is the second target programmed state, after provision of the second preprogram pulse a threshold voltage of the second class of memory cells is less than a second target threshold voltage, and the second target threshold voltage is a threshold voltage corresponding to the second target programmed state.

In other words, in the examples of the present application, the multiple classes of memory cells whose target programmed states are different may be preprogrammed respectively prior to the ISPP programming, so as to improve ±3σ tails of a threshold voltage distribution corresponding to a respective target programmed state.

A voltage of the second preprogram pulse may be referred to the above relevant implementation of the voltage of the first preprogram pulse, which is no longer repeated here.

Additionally, the second class of memory cells may be also a class of memory cells whose current state is far away from the target programmed state prior to ISPP programming. That is, before the provision of the second preprogram pulse, a distance between the state of the second class of memory cells and the second target programmed state is greater than a distance between a state of at least one other memory cell in the selected memory cell row and a respective target programmed state.

For example, for the threshold voltage distributions of the TLCs shown in FIG. 7, before the TLCs are programmed, all the memory cells are in the erased state. In this scenario, the first class of memory cells may be a class of memory cells whose target programmed state is P7, and the second class of memory cells may be a class of memory cells whose target programmed state is P6.

The first class of memory cells and the second class of memory cells are used above as examples for illustration. In the examples of the present application, more classes of memory cells may be preprogrammed prior to the ISPP programming.

In an example, multiple classes of memory cells requiring preprogramming may be determined before the ISPP programming, wherein each class of memory cells corresponds to a target programmed state, and a distance between a current state of each class of memory cells in the multiple classes of memory cells and the target programmed state is greater than a distance between a current state of other classes of memory cells in the selected memory cell row and a target programmed state. Then a preprogram pulse is provided to each class of memory cells in the multiple classes of memory cells for preprogramming. After the multiple classes of memory cells are preprogramed respectively, the ISPP programming is performed for the memory cells of the selected memory cell row.

For example, for the threshold voltage distributions of the TLCs shown in FIG. 7, before the TLCs are programmed, all the memory cells are in the erased state. As shown in FIG. 7, for four classes of memory cells whose target programmed states are P4, P5, P6, and P7 respectively, distances between current states of the four classes of memory cells and the target programmed states are all greater than distances between current states of the other classes of memory cells and the target programmed states, and thus the four classes of memory cells may be considered as memory cells requiring preprogramming. Then a preprogram pulse is provided to each class of memory cells in the four classes of memory cells for preprogramming. After the four classes of memory cells are preprogramed respectively, the ISPP programming is performed for the memory cells of the selected memory cell row.

It is to be noted that, in the above example for illustration, the memory cells whose current state is far away from the target programmed state are preprogramed. Alternatively, in the examples of the present application, each class of memory cells may be also programmed directly without screening, and the ISPP programming is performed for the memory cells of the selected memory cell row after the preprogramming, which is on longer described in detail here.

Taking FIG. 12 as an example, differences between a programming solution provided by the examples of the present application and a solution of performing the ISPP programming directly on the selected memory cell row are further illustrated below. For ease of subsequent illustration, the programming solution provided by the examples of the present application is referred to as solution one, and the solution of performing the ISPP programming directly on the selected memory cell row is referred to as solution two. FIG. 12 is a comparative schematic diagram of pulses provided by solution one and solution two during programming processes provided by examples of the present application. As shown in FIG. 12, an upper half portion of FIG. 12 is used to represent program pulses provided to the selected memory cell row in solution two, and for ease of subsequent illustration, the program pulses provided during the ISPP programming are referred to as ISPP program pulses for short. As shown in the upper half portion of FIG. 12, in solution two, after provision of each PP, one or more PV pulses are provided to verify whether the memory cells in the selected memory cell row reach the respective target programmed state. A lower half portion of FIG. 12 is used to represent program pulses provided to the selected memory cell row in solution one. As shown in the lower half portion of FIG. 12, before provision of the ISPP program pulses to the selected memory cell row, a preprogram pulse is also provided to each class of memory cells in the multiple classes of memory cells in the selected memory cell row, so as to implement the programming solution provided by the examples of the present application.

In summary, in the examples of the present application, before the selected memory cell row is programmed using ISPP, the first class of memory cells in the selected memory cell row are preprogrammed. On the one hand, the first class of memory cells are first programmed to the vicinity of the first target programmed state, so that the first class of memory cells can be programmed gradually to the first target programmed state during the subsequent programming using ISPP, thereby avoiding too fast programming. As such, the +3σ tail of the threshold voltage distribution can be improved. On the other hand, the first class of memory cells are first programmed to the vicinity of the first target programmed state, so that the first class of memory cells can be programmed to the first target programmed state just by injecting a small amount of electrons during the subsequent programming using ISPP, thereby reducing the IVS greatly. As such, the −3σ tail of the threshold voltage distribution can be improved. By improving the +3σ tail and the −3σ tail of the threshold voltage distribution, the range of the threshold voltage distribution can be narrowed, thereby achieving the effect of increasing the read window.

Currently, there are two ways of performing the ISPP programming on the memory, one is referred to as one-step ISPP programming, and the other is referred to as two-step ISPP programming. The example shown in FIG. 8 may be applied to the one-step ISPP programming, and may also be applied to the two-step ISPP programming. The one-step ISPP programming may be understood as causing each memory cell in the selected memory cell row to reach a respective target programmed state through one time of ISPP programming. The two-step ISPP programming may be understood as causing each memory cell in the selected memory cell row to reach a respective target programmed state through two times of ISPP programming.

They are explained and illustrated below via two examples respectively.

Figure 13:
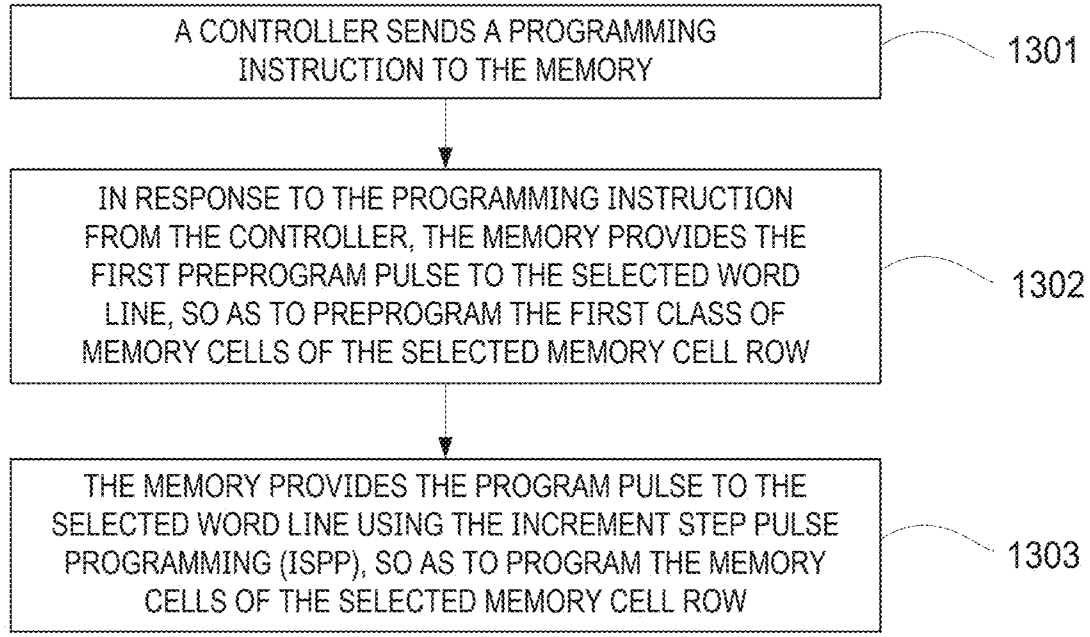
FIG. 13 is a flow diagram of another operation method of a memory device provided by examples of the present application.

FIG. 13 is a flow diagram of another operation method of a memory provided by examples of the present application. The method may apply to one-step ISPP programming. As shown in FIG. 13, the method comprises the following operations.

Operation 1301: A controller sends a programming instruction to the memory.

Operation 1302: In response to the programming instruction from the controller, the memory provides the first preprogram pulse to the selected word line, so as to preprogram the first class of memory cells of the selected memory cell row.

Operation 1303: The memory provides the program pulse to the selected word line using the increment step pulse programming (ISPP), so as to program the memory cells of the selected memory cell row.

In the method shown in FIG. 13, upon receiving the programming instruction from the controller, the memory preprograms the first class of memory cells in the selected memory cell row, prior to the one-step ISPP programming of the selected memory cell row, so as to improve the +3σ tail and the −3σ tail of the threshold voltage distribution of the first target programmed state.

In an example, in the method shown in FIG. 13, prior to the one-step ISPP programming of the selected memory cell row, each class of memory cells in the multiple classes of memory cells in the selected memory cell row may be preprogrammed respectively, so as to improve a +3σ tail and a −3σ tail of a threshold voltage distribution of a respective target programmed state. An example implementation may be referred to the example shown in FIG. 8, which is no longer repeated here.

It is to be noted that an execution order of operations in the method shown in FIG. 13 may be adjusted appropriately, serial numbers of the various operations do not constitute a limitation on the execution order of the various operations, and variations of the method, that are readily conceivable by any one skilled in the art, within the technical scope disclosed by the examples of the present application shall be covered by the protection scope of the examples of the present application, which are no longer repeated here.

Furthermore, in an example, the memory in the method shown in FIG. 13 may be also a TLC. In other words, upon receiving the programming instruction from the controller, the TLC first preprograms at least one class of memory cells in the memory cell row respectively, and then programs the selected memory cell row through the one-step ISPP programming.

For example, upon receiving the programming instruction from the controller, the TLC first preprograms each of the four classes of memory cells whose target programmed states are P4, P5, P6, and P7 respectively via a preprogram pulse, so that the four classes of memory cells reach the vicinity of the respective target programmed states respectively, and then programs the selected memory cell row through the ISPP programming, so that all the memory cells in the selected memory cell row reach respective target programmed states.

Figure 14:
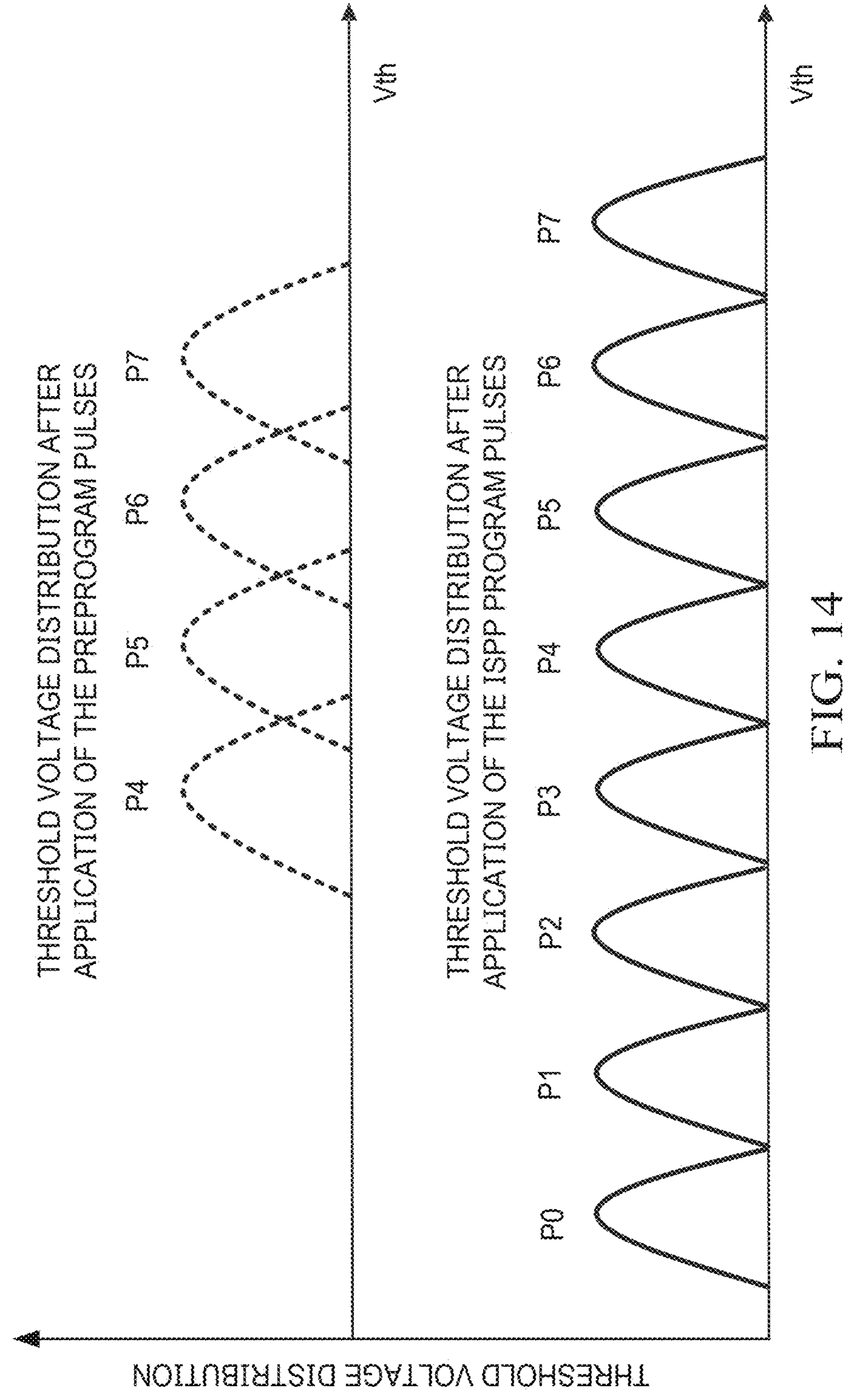
FIG. 14 is a schematic diagram of programmed state distributions in a TLC programming process provided by examples of the present application.

FIG. 14 is a schematic diagram of programmed state distributions in a TLC programming process provided by examples of the present application. As shown in FIG. 14, a preprogram pulse is first provided to each of the four classes of memory cells whose target programmed states are P4, P5, P6, and P7 respectively for preprogramming, and the threshold voltage distributions of the four classes of memory cells after the preprogramming are shown as dashed lines in an upper half portion of FIG. 14. Then the ISPP program pulses are provided to the selected memory cell row, and the threshold voltage distributions of the memory cells in the selected memory cell row after the provision of the ISPP program pulses are shown in a lower half portion of FIG. 14. As shown by a comparison between upper and lower half portions of FIG. 14, the threshold voltage distributions of the four classes of memory cells whose target programmed states are P4, P5, P6, and P7 respectively have not reached the respective target programmed states after the preprogramming, but are in the vicinity of the respective target programmed states, and reach the respective target programmed states only after the ISPP programming.

Figure 15:
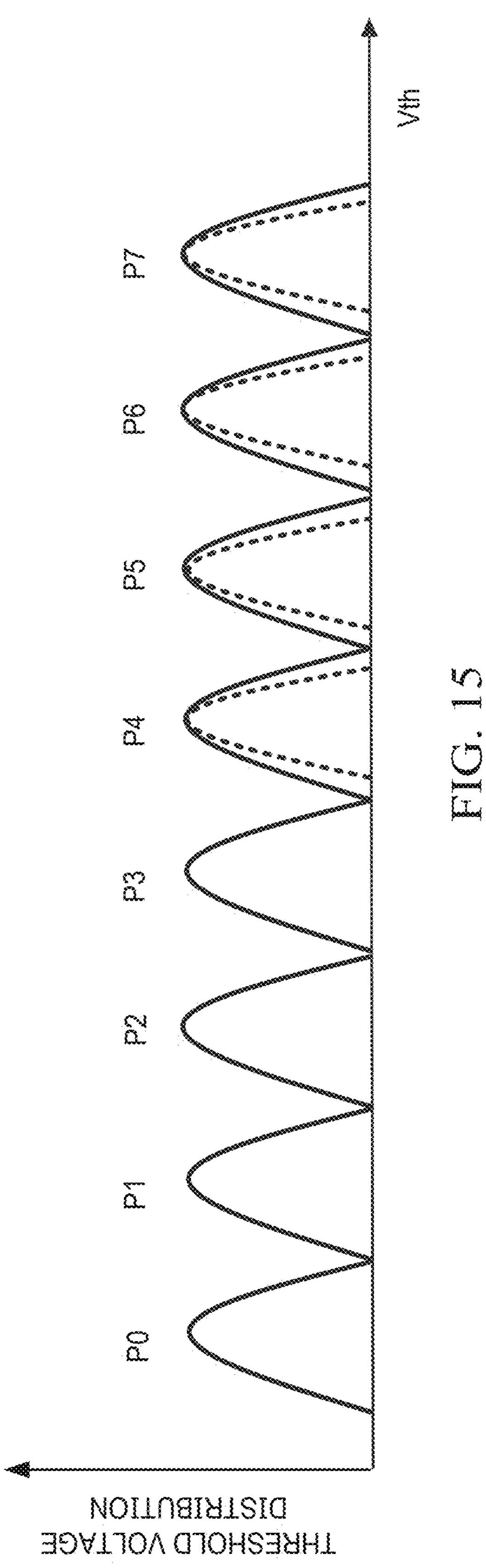
FIG. 15 is a comparative schematic diagram of threshold voltage distributions provided by examples of the present application.

FIG. 15 is a comparative schematic diagram of threshold voltage distributions provided by examples of the present application. Solid lines corresponding to various programmed states in FIG. 15 are schematic diagrams of the threshold voltage distributions of the TLC obtained by directly programming the selected memory cell row based on the one-step ISPP programming, e.g., schematic diagrams of the threshold voltage distributions of the TLC obtained by directly programming based on the one-step ISPP programming without preprogramming. The solid lines corresponding to programmed states P0-P3 and dashed lines corresponding to programmed states P4-P7 in FIG. 15 are schematic diagrams of the threshold voltage distributions of the TLC obtained through the programming shown in FIG. 14, e.g., schematic diagrams of the threshold voltage distributions of the TLC obtained by performing the preprogramming followed by the one-step ISPP programming.

As shown in FIG. 15, since prior to the one-step ISPP programming, a preprogram pulse is first provided to the four classes of memory cells whose target programmed states are P4, P5, P6, and P7 respectively for the preprogramming, the threshold voltage distributions of the four classes of memory cells are much narrower among the finally obtained threshold voltage distributions, that is, +3σ tails and −3σ tails of the threshold voltage distributions of the four classes of memory cells are improved.

It is to be noted that FIGS. 14 and 15 is illustrated using the TLC as an example. In an example, the example shown in FIG. 13 may be also applied to other types of memories, which are no longer illustrated here one by one via examples.

Figure 16:
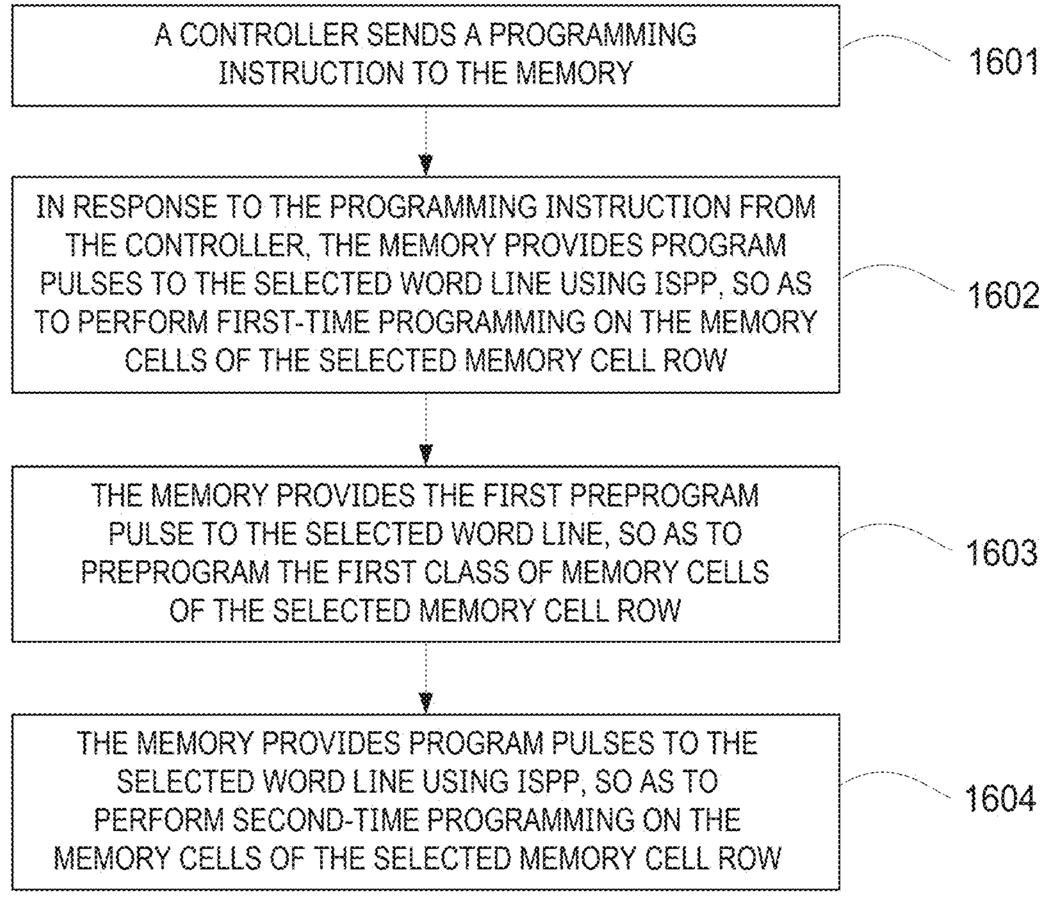
FIG. 16 is a flow diagram of further another operation method of a memory device provided by examples of the present application.

FIG. 16 is a flow diagram of another operation method of a memory provided by examples of the present application. The method is applied to two-step ISPP programming. As shown in FIG. 16, the method comprises the following operations.

Operation 1601: A controller sends a programming instruction to the memory.

Operation 1602: In response to the programming instruction from the controller, the memory provides program pulses to the selected word line using ISPP, so as to perform first-time programming on the memory cells of the selected memory cell row.

Operation 1603: The memory provides the first preprogram pulse to the selected word line, so as to preprogram the first class of memory cells of the selected memory cell row.

Operation 1604: The memory provides program pulses to the selected word line using ISPP, so as to perform second-time programming on the memory cells of the selected memory cell row.

The number of programmed states in threshold voltage distributions of the selected memory cell row after the second-time programming is greater than the number of programmed states in threshold voltage distributions of the selected memory cell row after the first-time programming. In other words, the selected memory cell row is first programmed to fewer programmed states through the first-time programming, and then programmed to more programmed states through the second-time programming. Therefore, the first-time programming is also referred to as ISPP rough programming, and the second-time programming is also referred to as ISPP fine programming.

It is to be noted that an execution order of operations in the operation method shown in FIG. 16 may be adjusted appropriately, serial numbers of the various operations do not constitute a limitation on the execution order of the various operations, and variations of the method, that are readily conceivable by any one skilled in the art, within the technical scope disclosed by the examples of the present application shall be covered by the protection scope of the examples of the present application, which are no longer repeated here.

Furthermore, the two-step ISPP programming is typically applicable to a memory with a large number of programmed states. For example, the memory is a QLC, and before the QLC is programmed, the programmed states of all the memory cells in the QLC are the erased state. Considering that a total number of the target programmed states of all the memory cells is 16, in order to avoid a severe IVS during the one-step ISPP programming process, the first-time programming is performed first on the QLC through ISPP, so that the threshold voltage distributions of the QLC after the first-time programming comprise four programmed states in the MLC or eight programmed states in the TLC; then the second-time programming is performed through ISPP, so that the threshold voltage distributions of the QLC after the second-time programming comprise 16 programmed states in the QLC. This process is also referred as follows: first programming the memory to the MLC or the TLC, and then programming the MLC or TLC to the QLC.

In the method shown in FIG. 16, upon receiving the programming instruction from the controller, the memory first performs the first-time programming of the two-step ISPP programming on the selected memory cell row, preprograms the first class of memory cells in the selected memory cell row after the first-time programming, and then performs the second-time programming of the two-step ISPP programming on the selected memory cell row.

In an example, upon receiving the programming instruction from the controller, the memory first performs the first-time programming of the two-step ISPP programming on the selected memory cell row, preprograms the multiple classes of memory cells in the selected memory cell row respectively after the first-time programming, and then performs the second-time programming of the two-step ISPP programming on the selected memory cell row. An example implementation may be referred to the example shown in FIG. 8, which is no longer repeated here.

Figure 17:
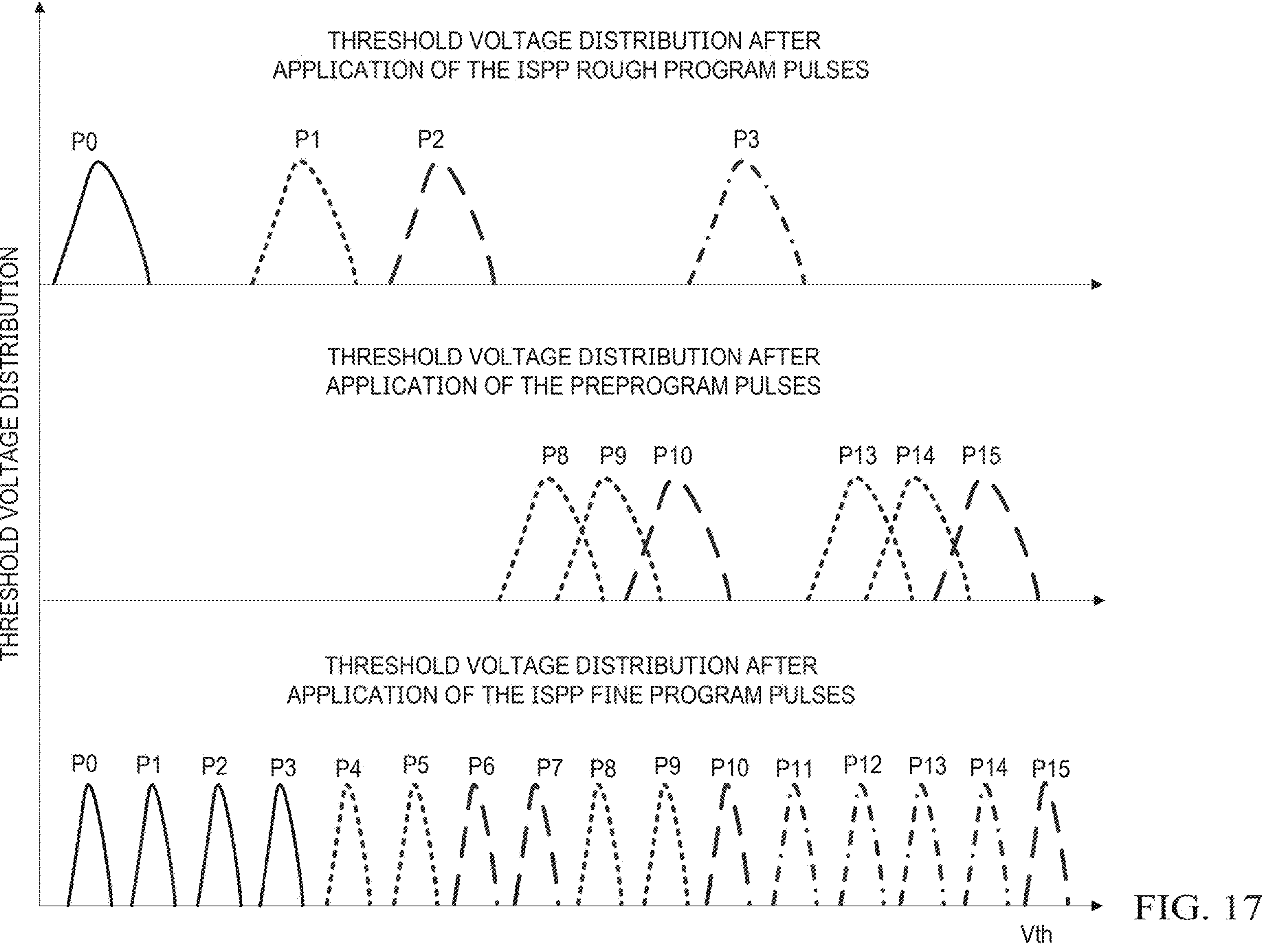
FIG. 17 is a schematic diagram of programmed state distributions in a QLC programming process provided by examples of the present application.

FIG. 17 is a schematic diagram of programmed state distributions in a QLC programming process provided by examples of the present application. As shown in FIG. 17, the memory cells in the selected memory cell row are first classified into four classes, e.g., one class of memory cells whose target programmed states comprise P0-P3, one class of memory cells whose target programmed states comprise P4, P5, P8, and P9, one class of memory cells whose target programmed states comprise P6, P7, P10, and P15, and one class of memory cells whose target programmed states comprise P11, P12, P13, and P14. After the first-time programming (e.g., the ISPP rough programming), current states of the memory cells whose target programmed states comprise P0-P3 are still P0 in a first row in FIG. 17, current states of the memory cells whose target programmed states comprise P4, P5, P8, and P9 are P1 in the first row in FIG. 17, current states of the memory cells whose target programmed states comprise P6, P7, P10, and P15 are P2 in the first row in FIG. 17, and current states of the memory cells whose target programmed states comprise P11, P12, P13, and P14 are P3 in the first row in FIG. 17. That is, the threshold voltage distributions of the selected memory cell row after the first-time programming comprise four programmed states.

After the first-time programming, the current states (P1 in the first row of FIG. 17) of the memory cells whose target programmed states are P8 and P9 are still far away from the respective target programmed states, the current states (P2 in the first row of FIG. 17) of the memory cells whose target programmed states are P10 and P15 are still far away from the respective target programmed states, and the current states (P3 in the first row of FIG. 17) of the memory cells whose target programmed states are P13 and P14 are still far away from the respective target programmed states. Therefore, a preprogram pulse is provided to each class of memory cells in the six classes of memory cells respectively, so that a current state (as shown in a second row of FIG. 17) of each class of memory cells in the six classes of memory cells reaches the vicinity of a respective target programmed state.

After the preprogramming, the second-time programming (also referred to as the ISPP fine programming) is performed on each memory cell in the selected memory cell row, so that the state of each memory cell in the selected memory cell row reaches the respective target programmed state. As shown in a third row of FIG. 17, for the QLC, the threshold voltage distributions of the selected memory cell row after the second-time programming comprises 16 programmed states.

Figures 18, 19:
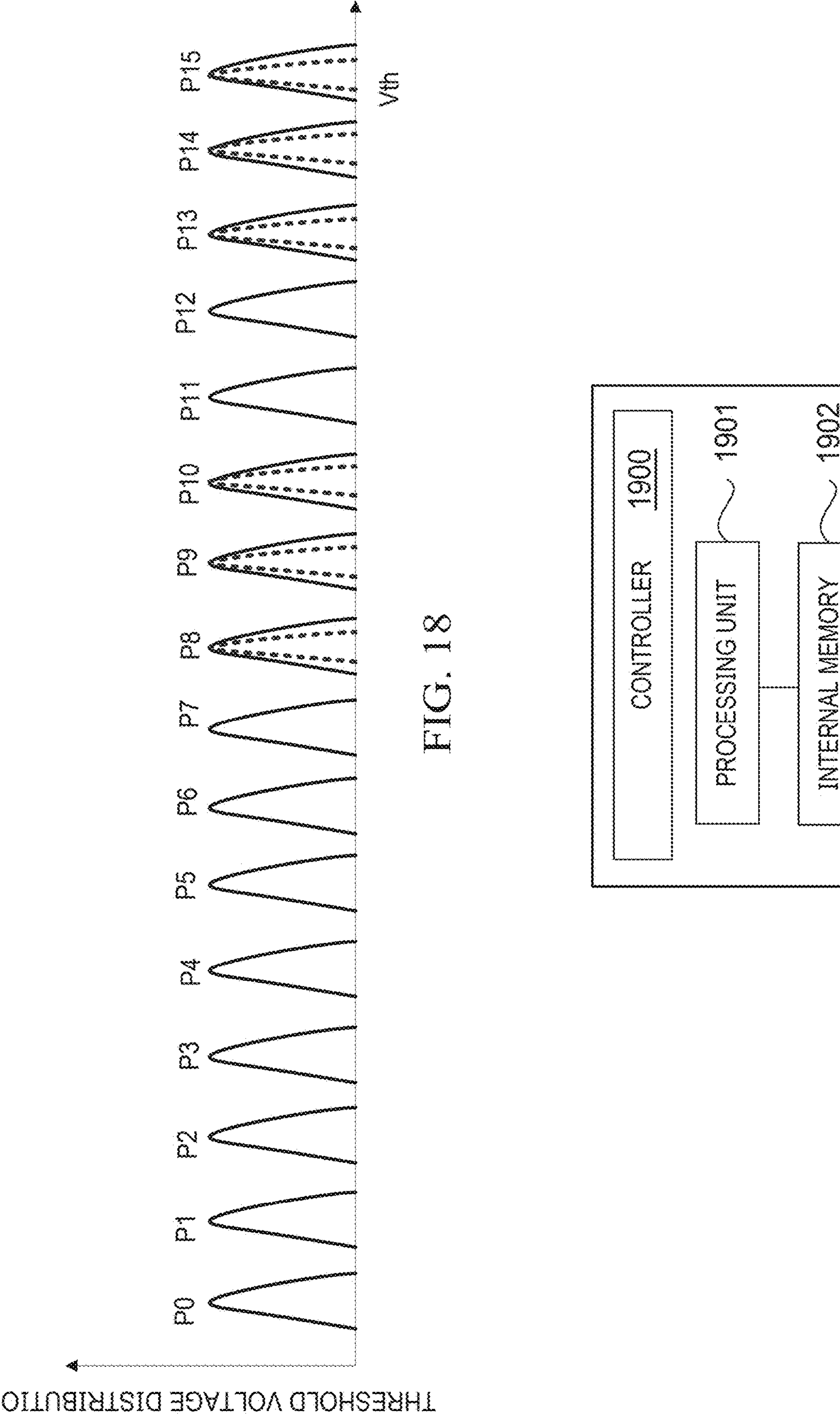
FIG. 18 is another comparative schematic diagram of threshold voltage distributions provided by examples of the present application.
FIG. 19 is a schematic structural diagram of a controller provided by examples of the present application.

FIG. 18 is another comparative schematic diagram of threshold voltage distributions provided by examples of the present application. Solid lines corresponding to various programmed states in FIG. 18 are schematic diagrams of the threshold voltage distributions of the QLC obtained by directly programming the selected memory cell row based on the two-step ISPP, e.g., schematic diagrams of the threshold voltage distributions of the QLC obtained by directly performing the two-step ISPP programming without preprogramming. The solid lines corresponding to programmed states P0-P7 and P11-P12 and dashed lines corresponding to programmed states P8-P10 and P13-P15 in FIG. 18 are schematic diagrams of the threshold voltage distributions of the QLC obtained through the programming shown in FIG. 17, e.g., schematic diagrams of the threshold voltage distributions of the QLC obtained by first performing the first-time programming of the two-step ISPP programming followed by preprogramming and then performing the second-time programming of the two-step ISPP programming.

As shown in FIG. 18, since prior to the second-time programming of the two-step ISPP programming, a preprogram pulse is first provided to each of the six classes of memory cells whose target programmed states are P8, P9, P10, P13, P14, and P15 respectively to preprogram, the threshold voltage distributions of the six classes of memory cells are much narrower among the finally obtained threshold voltage distributions, that is, +3σ tails and −3σ tails of the threshold voltage distributions of the six classes of memory cells are improved.

A programmed state that each memory cell is required to reach after the above first-time programming is related to a preset Gray code, and the examples of the present application do not limit the form of the Gray code.

It is to be noted that FIGS. 17 and 18 is illustrated using the QLC as an example. In an example, the example shown in FIG. 16 may be also applied to other types of memories, which are no longer illustrated here one by one via examples.

In addition, FIGS. 13 and 16 illustrate application scenarios of the examples of the present application using the one-step ISPP programming and the two-step ISPP programming as examples. In an example, the example shown in FIG. 8 may be also applied to more types of ISPP programming, which are no longer illustrated here one by one via examples.

Based on the examples shown in FIGS. 8-18, examples of the present application further provide a memory, which comprises: a memory array comprising a plurality of memory cell rows; a plurality of word lines coupled to the plurality of memory cell rows respectively; and a peripheral circuit coupled to the plurality of word lines and configured to implement the operation method of the memory provided by the examples of the present application.

In an example, the peripheral circuit is configured to: provide a first preprogram pulse to a selected word line to preprogram a first class of memory cells of a selected memory cell row, wherein a target programmed state of the first class of memory cells is a first target programmed state, after provision of the first preprogram pulse a threshold voltage of the first class of memory cells is less than a first target threshold voltage, and the first target threshold voltage is a threshold voltage corresponding to the first target programmed state; and provide program pulses to the selected word line using increment step pulse programming (ISPP), so as to program memory cells of the selected memory cell row.

An example implementation of above functions of the peripheral circuit may be referred to the examples shown in FIGS. 8-18, which is no longer repeated here.

Furthermore, examples of the present application also provide a memory system, which comprises a memory and a controller coupled to the memory and configured to control the memory.

In an example, the memory is configured to: provide a first preprogram pulse to a selected word line to preprogram a first class of memory cells of a selected memory cell row, wherein a target programmed state of the first class of memory cells is a first target programmed state, after provision of the first preprogram pulse a threshold voltage of the first class of memory cells is less than a first target threshold voltage, and the first target threshold voltage is a threshold voltage corresponding to the first target programmed state; and provide program pulses to the selected word line using increment step pulse programming (ISPP), so as to program memory cells of the selected memory cell row.

An implementation of above functions of the memory and the controller may be referred to the examples shown in FIGS. 13 and 16, which is no longer repeated here.

FIG. 19 is a schematic structural diagram of the controller provided by examples of the present application. As shown in FIG. 19, the controller 1900 comprises a processing unit 1901 and an internal memory 1902. The internal memory 1902 is configured to store computer instructions, and the processing unit 1901 is configured to execute the computer instructions to implement the operation method provided by the examples of the present application. In an example, the processing unit 1901 may be a microcontroller unit (MCU), etc.

The controller 1900 is configured to implement the functions of the controller in the above examples, so as to implement the memory system provided by the examples of the present application. An example implementation may be referred to the example of FIG. 13 or 16, which is no longer illustrated in detail here.

Furthermore, examples of the present application also provide a peripheral circuit, a control logic unit in which comprises at least one software module that is configured to implement any one of the operations in the operation method of the memory in the examples shown in FIGS. 8-18.

Furthermore, examples of the present application also provide a computer storage medium which stores instructions thereon that, when executed by the peripheral circuit in the memory, implements any one of the operations in the operation method of the memory in the examples shown in FIGS. 8-18.

On the other hand, a computer program product comprising instructions is provided, the instructions, when run in the peripheral circuit, implementing any one of the operations in the operation method of the memory in the examples shown in FIGS. 8-18.

Those of ordinary skill in the art may understand that all or part of the operations of the above examples may be completed through hardware, and may also be completed by a program instructing relevant hardware. The program may be stored in a computer readable storage medium. The storage medium mentioned above may be a read only memory, a disk, or an optical disk, etc.

The above descriptions are only good examples of the present application, and are not used to limit the present application. Any amendments, equivalent substitutions, and improvements etc. made within the spirits and principles of the present application shall be encompassed within the protection scope of the present application.

What is claimed is:

1. A memory device, comprising:

a memory array comprising a plurality of memory cells;

a plurality of word lines coupled to the plurality of memory cells; and a peripheral circuit coupled to the plurality of word lines and configured to:

apply a first preprogram pulse to a selected word line to preprogram a first class of memory cells of selected memory cells, wherein a target programmed state of the first class of memory cells is a first target programmed state, wherein after application of the first preprogram pulse a threshold voltage of the first class of memory cells is less than a first target threshold voltage, wherein the first target threshold voltage is a threshold voltage corresponding to the first target programmed state, wherein a difference between a voltage of the first preprogram pulse and a first target program voltage is less than a first difference threshold, and wherein the first target program voltage is set based on a program voltage required by a programmed state of the first class of memory cells to reach the first target programmed state; and apply program pulses to the selected word line using increment step pulse programming (ISPP) to program the selected memory cells.

2. The memory device of claim 1, wherein the peripheral circuit is further configured to:

apply a second preprogram pulse to the selected word line to preprogram a second class of memory cells of the selected memory cells, wherein a target programmed state of the second class of memory cells is a second target programmed state, after application of the second preprogram pulse a threshold voltage of the second class of memory cells is less than a second target threshold voltage, and the second target threshold voltage is a threshold voltage corresponding to the second target programmed state.

3. The memory device of claim 1, wherein before the application of the first preprogram pulse, a distance between a state of the first class of memory cells and the first target programmed state is greater than a distance between a state of at least one other memory cell in a selected memory cell row and a respective target programmed state.

4. The memory device of claim 1, wherein the peripheral circuit is further configured to:

determine the first preprogram pulse based on a difference between a current threshold voltage of at least one memory cell in the first class of memory cells and the first target threshold voltage.

5. The memory device of claim 4, wherein the peripheral circuit is configured to:

in response to the difference between the current threshold voltage of the at least one memory cell in the first class of memory cells and the first target threshold voltage exceeding a second difference threshold, configure the first preprogram pulse for the first class of memory cells.

6. The memory device of claim 1, wherein the peripheral circuit is configured to:

in response to a programming instruction from a controller, apply the first preprogram pulse to the selected word line to preprogram the first class of memory cells of the selected memory cells.

7. The memory device of claim 6, wherein the memory cells in the memory device are triple-level cells (TLC).

8. The memory device of claim 1, wherein the peripheral circuit is configured to:

in response to a programming instruction from a controller, apply the program pulses to the selected word line using the ISPP to perform first-time programming on the memory cells of the selected memory cells;

apply the first preprogram pulse to the selected word line to preprogram the first class of memory cells of the selected memory cells; and apply the program pulses to the selected word line using the ISPP to perform second-time programming on the memory cells of the selected memory cells, wherein a number of programmed states in threshold voltage distributions of a selected memory cell row after the second-time programming is greater than the number of programmed states in threshold voltage distributions of the selected memory cell row after the first-time programming.

9. The memory device of claim 8, wherein the memory cells in the memory device are quad-level cells (QLC).

10. A memory system, comprising:

a memory device; and a controller coupled to the memory device and configured to control the memory device, wherein the memory device is configured to:

apply a first preprogram pulse to a selected word line to preprogram a first class of memory cells of selected memory cells, wherein a target programmed state of the first class of memory cells is a first target programmed state, after application of the first preprogram pulse a threshold voltage of the first class of memory cells is less than a first target threshold voltage, and the first target threshold voltage is a threshold voltage corresponding to the first target programmed state, wherein a difference between a voltage of the first preprogram pulse and a first target program voltage is less than a first difference threshold, and wherein the first target program voltage is set based on a program voltage required by a programmed state of the first class of memory cells to reach the first target programmed state; and apply program pulses to the selected word line using increment step pulse programming (ISPP) to program the selected memory cells.

11. The memory system of claim 10, wherein:

the controller is configured to: send a programming instruction to the memory device; and the memory device is configured to: in response to the programming instruction from the controller, apply the first preprogram pulse to the selected word line to preprogram the first class of memory cells of the selected memory cells.

12. The memory system of claim 10, wherein:

the controller is configured to: send a programming instruction to the memory device; and the memory device is further configured to:

in response to the programming instruction from the controller, apply the program pulses to the selected word line using the ISPP to perform first-time programming on the memory cells of the selected memory cells;

apply the first preprogram pulse to the selected word line to preprogram the first class of memory cells of the selected memory cells; and apply the program pulses to the selected word line using the ISPP to perform second-time programming on the memory cells of the selected memory cells, wherein a number of programmed states in threshold voltage distributions of a selected memory cell row after the second-time programming is greater than the number of programmed states in threshold voltage distributions of the selected memory cell row after the first-time programming.

13. A method of operating a memory device, comprising:

applying a first preprogram pulse to a selected word line to preprogram a first class of memory cells of selected memory cells, wherein a target programmed state of the first class of memory cells is a first target programmed state, after application of the first preprogram pulse a threshold voltage of the first class of memory cells is less than a first target threshold voltage, and the first target threshold voltage is a threshold voltage corresponding to the first target programmed state, wherein a difference between a voltage of the first preprogram pulse and a first target program voltage is less than a first difference threshold, and wherein the first target program voltage is set based on a program voltage required by a programmed state of the first class of memory cells to reach the first target programmed state; and applying program pulses to the selected word line using increment step pulse programming (ISPP) to program the selected memory cells.

14. The method of claim 13, before applying the program pulses to the selected word line using the increment step pulse programming (ISPP) further comprising:

applying a second preprogram pulse to the selected word line to preprogram a second class of memory cells of the selected memory cells, wherein a target programmed state of the second class of memory cells is a second target programmed state, after application of the second preprogram pulse a threshold voltage of the second class of memory cells is less than a second target threshold voltage, and the second target threshold voltage is a threshold voltage corresponding to the second target programmed state.

15. The method of claim 13, wherein before the application of the first preprogram pulse, a distance between a state of the first class of memory cells and the first target programmed state is greater than a distance between a state of at least one other memory cell in a selected memory cell row and a respective target programmed state.

16. The method of claim 13, before the application of the first preprogram pulse to the selected word line, further comprising:

determining the first preprogram pulse based on a difference between a current threshold voltage of at least one memory cell in the first class of memory cells and the first target threshold voltage.

17. The method of claim 16, wherein the determining the first preprogram pulse based on the difference between the current threshold voltage of at least one memory cell in the first class of memory cells and the first target threshold voltage comprises:

in response to the difference between the current threshold voltage of the at least one memory cell in the first class of memory cells and the first target threshold voltage exceeding a second difference threshold, configuring the first preprogram pulse for the first class of memory cells.

18. The method of claim 13, wherein the application of the first preprogram pulse to the selected word line comprises:

in response to a programming instruction from a controller, applying the first preprogram pulse to the selected word line to preprogram the first class of memory cells of the selected memory cells.

* * * * *